United States Patent
Jelezko et al.

(10) Patent No.: US 10,649,044 B2
(45) Date of Patent: May 12, 2020

(54) METHOD FOR THE HYPERPOLARISATION OF NUCLEAR SPINS

(71) Applicant: Universität Ulm, Ulm (DE)

(72) Inventors: Fedor Jelezko, Ulm (DE); Martin Plenio, Ulm (DE); Ilai Schwartz, Ulm (DE); Qiong Chen, Ulm (DE); Alex Retzker, Jerusalem (IL)

(73) Assignee: UNIVERSITÄT ULM, Ulm (DE)

( * ) Notice: Subject to any disclaimer, the term of this patent is extended or adjusted under 35 U.S.C. 154(b) by 268 days.

(21) Appl. No.: 15/576,018

(22) PCT Filed: May 22, 2015

(86) PCT No.: PCT/EP2015/061465
§ 371 (c)(1),
(2) Date: Nov. 21, 2017

(87) PCT Pub. No.: WO2016/188557
PCT Pub. Date: Dec. 1, 2016

(65) Prior Publication Data
US 2018/0149717 A1   May 31, 2018

(51) Int. Cl.
*G01R 33/28* (2006.01)
*G01N 24/12* (2006.01)
(Continued)

(52) U.S. Cl.
CPC .......... *G01R 33/282* (2013.01); *G01N 24/12* (2013.01); *G01R 33/26* (2013.01); *G01R 33/5601* (2013.01); *G01R 33/62* (2013.01)

(58) Field of Classification Search
CPC .. G01R 33/282; G01R 33/26; G01R 33/5601; G01R 33/62
(Continued)

(56) References Cited

U.S. PATENT DOCUMENTS

| 10,330,750 B2* | 6/2019 | Meriles ............... G01R 33/282 |
| 2013/0184565 A1* | 7/2013 | Krummenacker ... G01R 33/282 600/420 |
| 2018/0113185 A1* | 4/2018 | Rosen ................. G01R 33/282 |

FOREIGN PATENT DOCUMENTS

| WO | 2014/165845 A1 | 10/2014 |
| WO | WO 2014/165845 A1 | 10/2014 |

OTHER PUBLICATIONS

Weis et al.; "Electron-nuclear cross polarization"; Solid State Nuclear Magnetic Resonance; Available online—Nov. 18, 2005; Edition 29 in 2006 (Year: 2005).*

(Continued)

*Primary Examiner* — Melissa J Koval
*Assistant Examiner* — Rahul Maini
(74) *Attorney, Agent, or Firm* — Finnegan, Henderson, Farabow, Garrett & Dunner, LLP

(57) ABSTRACT

A method of hyperpolarisation of nuclear spins in one or more particle(s) moving relatively to a polarisation structure, wherein a polarisation of electron spins in the polarisation structure is transferred to the nuclear spins in the particle(s), wherein for one or more of the moving particle(s) within 20 nm from a surface of the polarisation structure, the correlation time of the interaction with the nearest polarisation structure electron spin due to the molecular motion is larger than the inverse of the nuclear Larmor frequency; the electron spins in the polarisation structure are polarised above thermal equilibrium; and the polarisation transfer is performed resonantly.

17 Claims, 14 Drawing Sheets

(51) Int. Cl.
  *G01R 33/26* (2006.01)
  *G01R 33/56* (2006.01)
  *G01R 33/62* (2006.01)

(58) Field of Classification Search
  USPC .......................................................... 324/304
  See application file for complete search history.

(56) References Cited

OTHER PUBLICATIONS

Decision of Rejection for Japanese Patent Application No. 2018-512480 from the Japanese Patent Office, dated Feb. 19, 2019, with English machine translation (10 pages).
C. Belthangady et al. "Dressed-State Polarization Transfer between Bright & Dark Spins in Diamond", arXiv:1211.2749v1 [quant-ph], Nov. 12, 2012.
H-J. Wang et al. "Sensitive magnetic control of ensemble nuclear spin hyperpolarization in diamond", Nature Communications 4, Published Jun. 5, 2013.
Abrams, D., et al., Dynamic Nuclear Spin Polarization of Liquids and Gases in Contact with Nanostructured Diamond, Nano Letters, Apr. 22, 2014, vol. 14, No. 5, pp. 2471-2478.

* cited by examiner b, nanoparticles with color centers in a suspension a, microfluidic channel c, grating or pillars with color centers c, double quantum transition a, nanodiamond distribution in solution b, Integrated solid effect

METHOD FOR THE HYPERPOLARISATION OF NUCLEAR SPINS

FIELD OF THE INVENTION

The invention concerns a method of hyperpolarisation of nuclear spins by means of transferring the polarisation of electron spins to the nuclear spins. More specifically, the invention concerns methods of hyperpolarisation of nuclear spins in one or more particle(s) moving relatively to a polarisation structure, in which methods a polarisation of electron spins in the polarisation structure is transferred to the nuclear spins in the particle(s). The invention also concerns a method of hyperpolarisation of nuclear spins in a material outside a polarisation structure, wherein a polarisation of electron spins in the polarisation structure is transferred to the nuclear spins.

BACKGROUND OF THE INVENTION

In a diamond, electron spins in a particular kind of colour centre, a nitrogen vacancy centre, can be polarised optically independent of ambient temperature. T Staudacher et al in "Nuclear Magnetic Resonance Spectroscopy on a (5 nanometre)$^3$ Sample Volume", Science (2013) demonstrate a scheme for sensing nuclear spin ensembles 5 nm (nanometres) from the diamond surface using shallow (close to surface) nitrogen vacancy centres. The authors note that a scheme for polarising the external nuclear spins can be developed, and might operate probably on a similar timescale to the detection. However, the authors have not provided any details as to how such a scheme could be achieved. Moreover, it appears that no clear scheme was thought of, as it currently appears that producing such a high polarisation rate with the proposed setup is not feasible, especially for small molecules, where the effect of molecular movement needs to be taken into account. In addition, the authors have only considered molecules in a (5 nm)$^3$ radius.

In "Dynamic Nuclear Spin Polarization of Liquids and Gases in Contact with Nanostructured Diamond", Nano Letters (2014) D Abrams et al show simulative results of polarisation of nuclear spins in a liquid in contact with a diamond surface filled with shallow nitrogen vacancy centres. The scheme uses direct polarisation of nuclear spins adsorbed on the surface of the diamond via the nitrogen vacancy (NV) centres and report a 0.2% to 2% polarisation of the external nuclear spins in a very small volume in a few seconds; the volume is a liquid layer of 0.5 µm (micrometres) thickness and 50 µm in length and width. Yet, the polarisation rate achieved is too low for polarising substantial volumes with reasonable optical intensity (even in optimized configurations)—over 10,000 seconds for polarising a microliter of fluid. Additionally, the presented scheme does not involve a coherent transfer of the polarisation from the NV centres to the nuclear spins—the main reason for the slow polarisation rate achieved.

The above analysis is also discussed in WO 2014/165845 A1. Three classes of motifs for the transfer of polarisation from a diamond to target nuclei external to the diamond are contemplated. Transfers governed by direct interactions between NV centres and external nuclei, transfers that utilize $^{13}C$ nuclei hyperpolarisation within optically pumped diamond, and transfers mediated by other paramagnetic centres near the diamond's surfaces.

In "Dressed-State Polarization Transfer between Bright & Dark Spins in Diamond", Physical Review Letters (2013), C Belthangady et al report the polarisation of electron spins in a nitrogen vacancy centre in diamond by optical pumping. The polarisation of the nitrogen centre electron spins can then be transferred to substitutional nitrogen electron spins by applying electromagnetic fields analogous to the Hartmann-Hahn matching condition. In this publication, only electron spins inside the diamond are polarised.

In "Sensitive magnetic control of ensemble nuclear spin hyperpolarization in diamond", Nature Communication (2013), H-J Wang et al show polarisation of nuclear spins in contact interaction with a nitrogen vacancy colour centre in a diamond using the ground state level anti-crossing of the centre. The method shown was only relevant for nuclear spins inside the diamond, and not to external molecules.

In magnetic resonance applications, it is desirable to reach a higher degree of polarisation of the nuclear spins in the external molecules, in a higher volume and more quickly, than has hitherto been accomplished.

Problem According to the Invention

The object of the invention is to provide an improved method of hyperpolarisation of nuclear spins by means of transferring the polarisation of electron spins to the nuclear spins. In some aspects, the invention addresses the problem of providing methods of hyperpolarisation of nuclear spins in one or more particle(s) moving relatively to a polarisation structure, in which methods a polarisation of electron spins in the polarisation structure is resonantly transferred to the nuclear spins in the particle(s). The invention moreover aims to provide a method of hyperpolarisation of nuclear spins in a material outside a polarisation structure, wherein a polarisation of electron spins in the polarisation structure is transferred to the nuclear spins.

Solution According to the Invention

Hyperpolarisation of the Nuclear Spins in Moving Particles

Molecular motion can play an instrumental role in the polarisation of particles, for example if they are dissolved or suspended in a solvent or a suspension agent. Thus, polarisation of particles exhibiting molecular motion by electron spins is typically performed with non-resonant transfer (e.g. the Overhauser effect), with a strong limitation on the transfer efficiency given by the molecular motion correlation time.

In one aspect of the invention the problem is solved by a method according to claim 1. It is an achievable advantage of this aspect of the invention that a negative effect of diffusion on the polarisation of the particles' nuclear spins can be reduced.

In the context of the present invention, the correlation time of the interaction between the electron spins and the nuclear spins is defined as usual—the mean time in which the correlation of the interaction decays to 1/e of its initial value (i.e. $<g(t)g(t+\tau_c)>=<g^2>1/e$, with g denoting the interaction).

The invention i. a. exploits that if the motion of the particles in proximity to the polarisation structure occurs on a timescale slower than the nuclear spin Larmor frequency (i.e. $\omega\tau_c>1$, with $\omega$ indicating the nuclear Larmor frequency and $\tau_c$ the correlation time of the interaction with the nearest polarisation structure electron spin due to the molecular motion), resonant transfer becomes achievable. Moreover, the polarisation transfer rate increases with $\tau_c$.

In the context of the present invention, "in proximity to the polarization structure" is defined as a distance shorter than 100 nm from a surface of the polarization structure, more preferably shorter than 10 nm from the surface of the polarization structure.

In the context of the present invention, polarisation is defined according to the standard definition: The number of polarisable nuclear spins polarised in the preferred direction minus the number in the opposite direction, divided by the total number of polarisable nuclear spins. "Hyperpolarisation" means polarisation well above the thermal equilibrium. "Polarisation structure" refers to a material in which electron spins can be hyperpolarised, which polarisation can be transferred to the particles' nuclear spins. In the context of the present invention, electron spins in the polarisation structure refer to electron spins which can be hyperpolarised, except when used in the context of mediating electron spins. In other words, in the nomenclature applied here electron spins in the polarisation structure which are not hyperpolarised (e.g. P1 centres in diamond) do not constitute "polarising electron spins". This is with the exception of mediating electron spins, which are discussed further below. As explained in more details below, the "transfer" can occur directly from the polarisation structure to the particles or indirectly with the help of a mediator. In the context of the present invention, polarisable nuclear spins are defined as any species of nuclei with nonzero spin, such as $^1$H, $^{13}$C, $^{15}$N, $^{19}$F, $^{29}$Si, $^{31}$P, etc.

A "particle" in the context of the present invention is a structure, the nucleus or one or more nuclei of which can be polarised by means of transferring a polarisation from the polarisation structure to the particle. The particle either has a different composition or a different inner structure, e. g. a different crystalline structure, than the polarisation material, or it has the same composition and structure but is separate from polarisation material. The particle can for example be an atom or a molecule. However, it can also be a larger structure, for example a crystal or an amorphous structure.

In the context of the present invention "resonant transfer" means a transfer of spin polarisation that is mediated by a distance dependent interaction between electron spin and nuclear spins where in a suitable frame of reference the difference in transition energies between the electronic and nuclear polarisation states is smaller than the total interaction of the electron spin with all target nuclear spins. Thus, a resonant transfer would achieve a transfer of spin polarisation even without the molecular motion of the particles.

It is an achievable advantage of the present invention that because the polarisation process does not need to rely on specific chemical processes, it is suitable for the hyperpolarisation of a very wide range of particles, including many types of molecules, including proteins, nucleic acids and other molecules that play an important role in the human or animal body.

Polarisation Transfer with the Help of a Mediator Outside the Polarisation Structure In another aspect of the invention, the problem is solved by a method according to claim 3. It is an achievable advantage of this aspect of the invention that the transfer of spin polarisation from the electron spins in the polarisation structure to the nuclear spins in the particles is accelerated. In particular, with this aspect of the invention it can be exploited that at a given distance the coupling between electron spins can be stronger (for example by a factor in the range of more than 100 or even more than 1000) than between an electron spin and the spin of a nucleus. Moreover, with this aspect of the invention it can be exploited that the electron due to its location on the surface or distanced from the polarisation structure is closer to the nuclear spins to which the polarisation is to be transferred, thereby facilitating polarisation transfer. The synergetic cooperation of these effects can lead to a substantial increase of the speed of polarisation of the nuclear spins in the particles.

In the context of the present invention, "outside" means that the mediator electrons are electrons on the surface or external to the polarisation structure.

PREFERRED EMBODIMENTS OF THE INVENTION

Preferred features of the invention which may be applied alone or in combination are discussed below and in the dependent claims. Reference numerals in the claims have merely been introduced to facilitate reading of the claims and are by no means meant to limit the scope of the claims to certain embodiments.

Hyperpolarisation of the Nuclear Spins in Moving Particles

In a preferred method of hyperpolarisation of nuclear spins, the one or more particle(s) move relatively to a polarisation structure, wherein a polarisation of electron spins in the polarisation structure is transferred to the nuclear spins in the particle(s). The preferred particles can move relatively to the polarisation material and relatively to each other. Preferably, the particles perform a diffusional motion. For one or more of the moving particles, the characteristic correlation time of the interaction with the nearest polarisation structure electron spin due to the molecular motion ($\tau_c$) is preferably larger than the inverse Larmor frequency of the nuclear spins. $\tau_c$ can be increased either by a smaller diffusion coefficient in proximity to the polarisation structure or using a deeper electron spin in the polarisation structure (as then the particle needs to cover a larger distance in order to significantly change the interaction strength). As a large correlation time improves the efficiency of the resonant polarisation transfer, preferably the product of the correlation time and the total coupling strength of the nuclear spins in the particles to the electron spin is larger than 0.01, more preferably larger than 0.1, most preferably larger than 1.

Preferably, for at least 10% of the particles within 10 nm—more preferably within 100 nm—of the polarisation structure the interaction correlation time is larger than the nuclear Larmor frequency. Even more preferably, for at least 20%—more preferably at least 50%, more preferably at least 90%—of the particles within 10 nm—more preferably within 100 nm—of the polarisation structure the interaction correlation time is larger than the nuclear Larmor frequency.

The preferred diffusion coefficient D of the particles in proximity to the polarisation structure is lower than $10^{-10}$ m$^2$/s, more preferably lower than $10^{-12}$ m$^2$/s, most preferably lower than $10^{-13}$ m$^2$/s. A low diffusion coefficient D can contribute to a small characteristic diffusion length. The diffusion coefficient D of the moving particle(s) preferably is greater than $10^{-20}$ m$^2$/s, more preferably greater than $10^{-17}$ m$^2$/s, most preferably greater than $10^{-14}$ m$^2$/s. A large diffusion coefficient D can expedite the polarisation of a larger volume containing the particles.

In a preferred embodiment of the invention, the diffusion coefficient D of the moving particle(s) which are not in proximity to the polarisation structure is greater than $10^{-12}$ m$^2$/s. It is an achievable advantage of this embodiment of the invention that by means of diffusion of particles to and from the vicinity of the polarisation structure particles in a large volume containing these particles can be polarised. More specifically, diffusion can cause hyperpolarised particles to move away from the vicinity of the polarisation structure, allowing the polarisation of a larger volume containing the particles, while at the same time new unpolarised particles can take the place of already hyperpolarised particles in the vicinity of the polarisation structure, thus maintaining the efficiency of the polarisation transfer. More specifically, by choosing a diffusion coefficient D of the moving particles of greater than $10^{-14}$ m$^2$/s a cubical volume of over 1 µm$^3$ can be polarised within only a few minutes by each electron spin in the polarisation structure. Thus, a significant volume of polarised particles per second is achievable via all the electron spin in the polarisation structure.

Preferably, the particles are part of a liquid. More preferably, the particles are part of a solution, either as a material dissolved in a liquid solvent or as part of the solvent itself, or the particles are part of a liquid suspension, either as part of a material suspended in a suspensory agent or as part of the suspensory agent itself. If the particles are part of a solution or suspension, the particles' diffusion can for example be lowered by changing the concentration of the particles in a solution or a suspension, by changing the composition of the solvent or the suspension agent, by lowering the temperature of the solution or suspension or by using larger particles to be polarised. Changes to the composition of the solution or suspension can result in a dramatically lower molecular diffusion coefficient. There are many biocompatible molecules which when added in high concentration to a solution or suspension, greatly reduce the molecular motion and diffusion coefficients. For examples, in He, Xiaoming, Alex Fowler, and Mehmet Toner. "Water activity and mobility in solutions of glycerol and small molecular weight sugars: Implication for cryo- and lyo-preservation." *Journal of Applied Physics* 100.7 (2006): 074702, He et al show the effect of mixing water with glycerol, fructose, sucrose and trehalose, and the dramatic decrease in the water diffusion coefficient with the increase in the concentration of the added molecules. The relevant portions of the publication of He at al with regard to this finding are incorporated into the present disclosure by way of reference.

Yet, the invention also encompasses embodiments in which the particles are simply stacked-up in a gas or a vacuum. Moreover, in some embodiments of the invention, there is only a single particle which in some embodiments is moving and in other embodiments is stationary relatively to a polarisation structure. The particle or particles preferably are solid, in particular in the case of the particles being suspended or stacked up or in cases where there is only a single particle. It is an achievable advantage of a solid that the motion (typically the molecular motion) inside the solid is sufficiently limited as to not adversely affect the polarisation transfer.

The Polarisation Structure

The preferred polarisation structure comprises—more preferably consists of—diamond. A diamond according to the invention can be a synthetic diamond or a naturally occurring diamond. Electron spins in diamond particularly suitable for polarisation and polarisation transfer according to the invention are colour centres (as defined further below), preferably an NV centres (see for example Jelezko, Fedor, et al "Observation of coherent oscillations in a single electron spin." *Physical review letters* 92.7 (2004): 076401; the relevant portions of the publication of Jelezko et al with regard to this finding are incorporated into the present disclosure by reference.) Synthetic diamonds according to the invention can be produced, e.g., by chemical vapour deposition (CVD).

In an alternative embodiment of the invention, the polarisation structure comprises—more preferably consists—of silicon carbide, such as 4H-SiC or 6H-SiC. Electron spins in silicon carbide particularly suitable for polarisation and polarisation transfer according to the invention are divacancies, which are common defects in semiconductors comprised of neighbouring isolated vacancies. Yet, other lattice defects in silicon carbide are suitable as well, such as silicon vacancies (SiV), carbon vacancies (VC) (see for example Kraus, H., et al (2014) Room-temperature quantum microwave emitters based on spin defects in silicon carbide, *Nat Phys* 10, 157-162; the relevant portions of the publication of Kraus et al with regard to this finding are incorporated into the present disclosure by way of reference.) In some embodiments of the invention the electron spins to be polarised in the silicon carbide are those of silicon oxide vacancy centres.

In another alternative embodiment of the invention, the polarisation structure comprises—more preferably consists—of zinc oxide (ZnO). Electron spins in zinc oxide particularly suitable for polarisation and polarisation transfer are oxygen vacancies (see for example Rodnyi, P A, and Khodyuk, I. V. (2011) Optical and luminescence properties of zinc oxide (Review), *Opt Spectrosc+* 111, 776-785; the relevant portions of the publication of Rodnyi and Khodyuk with regard to this finding are incorporated into the present disclosure by way of reference.)

Other potential material with suitable colour centres includes crystalline quartz (see for example Hayes, W et al (1984) ODMR of Recombination Centers in Crystalline Quartz, *J Phys C Solid State* 17, 2943-2951; the relevant portions of the publication of Hayes et al with regard to this finding are incorporated into the present disclosure by way of reference) and silicon oxide.

The polarisation structure's hyperpolarised electron spins, the polarisation of which is to be transferred to the particles' nuclear spins, preferably are located within less than 30 nm of at least one surface of the polarisation structure, more preferably less than 10 nm of at least one surface of the polarisation structure, less than 5 nm of at least one surface of the polarisation structure.

The polarisation structure can be of any shape which enables the particles or the mediators to come into proximity of the polarisation structure's electron spins, the polarisation of which is to be transferred to the particles. Moreover, the preferred polarisation structure allows laser, radio frequency and/or microwave irradiation of the electron spins in order to polarise them. For example, walls of the polarisation structure can act as interfaces at which polarisation transfer occurs. The polarisation structure may be coated with a different material, for example in order to prevent it from reacting chemically with the particles or a solvent or suspension agent in which the particles are suspended or dissolved.

In certain preferred embodiments, the polarisation structure is combined with one or several microfluidic structures. For example, the polarisation structure may comprise microfluidic channel through which the particles, preferably dissolved or suspended in a solution or a suspension of the particles, can flow. The polarisation structure may contain one or more holes through which the particles, preferably a solution or a suspension of the particles, can flow. Other possible geometries of the polarisation structure comprise nano-pillars, thin sheets, nanocrystals arrayed in a packed-bed-type geometry, and nanocrystals suspended in a solution or suspension in which the particles are dissolved or suspended as well.

Preferably, the polarisation structure is devised in a configuration that enables the solution to flow past the polarisation structure at a constant velocity. As there exists a trade-off between the polarisation achieved and the rate at which the particles are polarised, the velocity preferably is optimized to fit the requirements of the specific geometry and application.

As the invention includes several preferred geometries for the polarisation structure, a unified definition needs to be introduced. The "polarisation surface area" is defined as the surface area of the polarisation structure in which polarisation is transferred to nearby particles. In this area, the electron spins in the polarisation structure are hyperpolarized, and need to be close to the surface (as defined above). The "polarisation rate per colour centre" is defined as the number of nuclear spins polarized on average by each colour centre involved in the polarisation per unit time. The "solution polarisation rate" is defined as the number of hyperpolarised particles per unit time, and depends on the polarisation rate per colour centre, on the polarisation surface area, and on the density of colour centres per surface area.

Preferably, the polarisation surface area is enlarged to increase the ratio of polarised particles to unpolarised ones. This can be achieved by choosing structure configurations with a large surface to volume ratio. In preferred embodiments, the optical polarisation area is increased by creating optical cavities which enable a larger number of the electron spins to be hyperpolarised, thus potentially increasing the polarisation surface area.

Preferably the polarisation rate per colour centre is at least 10 Hz, more preferably at least 1 KHz, more preferably at least 10 KHz, most preferably at least 100 KHz. Preferably the colour centre concentration in the polarisation surface area is at least $10^{12}$ per $m^2$, more preferably at least $10^{14}$ per $m^2$, most preferably at least $10^{16}$ per $m^2$. Preferably the solution polarisation rate is at least $10^4$ particles per second, more preferably $10^7$ particles per second, more preferably $10^{11}$ particles per second, most preferably $10^{14}$ particles per second.

Polarisation of the Polarisation Structure's Electron Spins

Preferably, the electron spins in the polarisation structure are polarised above thermal equilibrium. The preferred electron spins to be polarised in the polarisation structure are colour centres. A "colour centre" is a point defect in a crystal lattice, in which a vacancy is filled by one or more electrons. The electron spins at a suitable colour centre can be polarised by optical pumping. Optically polarised colour centre electron spins can be transferred to proximal nuclear spins to create nuclear polarisation. A preferred colour centre is a nitrogen vacancy (NV) centre in a diamond. An NV centre is especially well-suited for the optical pumping of its electron spins. Yet, atom substitutes other than nitrogen are also possible for forming a colour centre, e.g. silicon (Si). In silicon carbide, the electron spins to be polarised can for example be those of silicon oxide vacancy centres, silicon vacancy (SiV) centres, carbon vacancy (VC) centres, or di-vacancy centres. In zinc oxide, the preferred electron spins to be polarised are oxygen vacancies.

The electron spin polarisation can be optically induced not only in the ground state. For example, in oxygen vacancy defects in diamond, the spin polarisation is induced in an excited triplet state (see for example Hiromitsu, I, J Westra, and M Glasbeek. "Cross-relaxation effects in the 2.818-eV zero-phonon emission in brown diamond." *Physical Review B* 46.9 (1992): 5303). The relevant portions of this publication are incorporated into the present disclosure by way of reference.

Preferably, electron spins in the polarisation structure are polarised by means of optical pumping. Electron spins in the polarisation structure can be initialized optically to a certain spin state. This is for example demonstrated by optically detected magnetic resonance (ODMR). After the initialization, the colour centre spin states are polarised to a much higher degree than the thermodynamic polarisation. For example, NV centres exhibit polarisation up to 95% after optical polarisation. In the context of the present invention, "optical pumping" is defined as the irreversible transfer of the quantum state of the electron spin to a specific state thanks to the combination of laser irradiation and spontaneous emission of the absorbed laser light. Preferably, the optical pumping is achieved by irradiating the electron spins inside the polarisation structure with monochromatic light. Preferred light sources for optical pumping include lasers, light emitting diodes (LEDs) and other light sources with a suitable wavelength (e.g. green light for NV centres in diamond, infrared and red for silicon vacancy in silicon carbide). Preferably, once an electron spin in the polarisation structure is polarised by means of optical pumping, the polarisation is transferred either to one or more nuclear spin or to one or more mediator electron spins.

Transfer of Polarisation

In preferred methods according to the invention, in order to facilitate the transfer of polarisation from the electron spins of the polarisation structure to the nuclei (directly or indirectly via mediators), an external microwave field or radio frequency (RF) field is applied. The external microwave field or radio frequency (RF) field may be continuous or pulsed. The application of the microwave field preferably serves to tune the coupling between the nuclear spins and the electron spins of the polarisation structure or the mediator electrons. Another purpose of the microwave field is, preferably, to narrow the line width of the electron and thus make the transfer of the polarisation of the electron spins to the nuclear spins more efficient. By applying the microwave field in this manner, it is preferably achievable to completely polarise the nuclei in a particle. It is an achievable advantage of these embodiments of the invention that the polarisation transfer from the electron spins to the nuclear spins can be accelerated. Many dynamic nuclear polarisation protocols as discussed below involve the application of an external microwave field or a radio frequency (RF) field.

Preferably, the magnetic flux density of the external magnetic field is smaller than 3 T. The method according to the invention allows for the use of external magnetic fields with a low magnetic flux density, preferably below 2 T, more preferably below 1 T and most preferably below 0.5 T. Advantageously, these magnetic flux densities can be achieved by a permanent magnet or an electromagnet, which does not rely on liquid cooling. It is an achievable advantage of the relatively low magnetic field that it allows the hyperpolarised particles to be produced inexpensively, on a large scale and in a relatively simple setup. Such simple setups can be incorporated into a hospital environment more easily, which may lead to a reduction in implementation costs.

The transfer preferably involves a resonant transfer of the polarisation. According to some embodiments, the polarisation is transferred by a standard dynamic nuclear polarisation (DNP) protocol for using dipolar interactions to transfer electron polarisation to nuclear spins. In the context of the present invention, "DNP protocols" are defined as protocols for transferring the polarisation from an electron spin is to the nuclear spins by microwave or RF irradiation of the sample. Advantageously, by means of a DNP the transfer of the polarisation from the electron spins to the surrounding, the hyperpolarisation nuclear spins can be accelerated.

Examples for suitable DNP protocols include single-electron/single-nuclei methods such as the solid effect and pulsed DNP methods such as the NOVEL sequence, the integrated solid effect or dressed-state solid effect, as well as multiple-electron, single nuclei methods such as the cross effect, thermal mixing, preferably using mediator electron spins. A review of many current DNP protocols can be found in Maly, Thorsten, et al "Dynamic nuclear polarisation at high magnetic fields." J Chem Phys 2008; 128(5): 052211 (see section II "Polarizing mechanisms in DNP experiments"). The relevant portions of this publication are incorporated into the present disclosure by way of reference. Most DNP protocols involve either interactions between electron spins or are based on two underlying physical mechanisms: fulfilling the Hartmann-Hahn condition and excitation of selective transitions (i.e. irradiation at a frequency matching the energy gap between two quantum states). The DNP protocols differ in the configurations for achieving these conditions and by the usage of microwave pulses or continuous microwave radiation.

According to the invention, the DNP protocols can be used for fulfilling the Hartmann-Hahn condition between the colour centre spin of the polarisation structure or the mediator electron and the nuclear spins or for excitation of selective transitions caused by the dipolar interaction of nuclear spin states with the electron spins of the polarisation structure or the mediator electron. The general concept of Hartmann-Hahn double resonance as described in Hartmann, S R and Hahn, E L, "Nuclear Double Resonance in the Rotating Frame", Physical Review, 1962, vol. 128, Issue 5, pp. 2042-2053, relevant portions of which are incorporated into the present disclosure by way of reference.

According to some DNP protocols, the Hartmann-Hahn condition is achieved. This condition requires that the Rabi frequency of the electron spin be equal to the Larmor frequency of the nuclear spin in some reference frame (both the Rabi frequency and Larmor frequency can be between dressed or bare eigenstates). In this case mutual spin flip-flops are allowed and the high electron spin polarisation can be transferred to the nuclear spins. Thus, transferring of the polarisation of the electron spins to the nuclear spins can be achieved. Preferably, the DNP method termed NOVEL is used to transfer spins from the electrons to the nuclear spins. In NOVEL, preferably, a $\pi/2$ rotation is carried out, followed by spin locking for an adequate time for the transfer of the electron spin to the nuclear spin to occur. Preferably, the Hartmann-Hahn condition is achieved by a microwave field or a radio frequency field, the intensity of the field being chosen to match the energy difference between dressed electron spin eigenstates and the nuclear spins in an external magnetic field.

Another preferred method for using the interaction between electron spins of the polarisation structure or the mediator electron and nuclear spins, according to some embodiments, involves excitation of selective transitions caused by the dipolar interaction of nuclear spin states with the electron spin. Focusing on a two particle system of an electron spin and a nuclear spin, the dipolar interaction causes a shift in the energy level of the combined two-spin quantum system. This shift induces different energy gaps between the two spin system states, meaning that each transition between states has a unique energy gap. This allows for external excitation of only one selected transition using pulses or continuous waves in a specific frequency tuned to the energy gap of that particular transition. Excitation of the transition between the state where the electron spin is polarised and the nuclear spin is not polarised to the opposite state (polarised nuclear spin, non-polarised electron spin) induces a polarisation transfer, used in the solid effect DNP protocol.

In another preferred embodiment, the polarisation is transferred by matching the colour centre excited or ground state level anti-crossing to the nuclear spin energy gap. In "Sensitive magnetic control of ensemble nuclear spin hyperpolarization in diamond", Nat Comm 4, 1940 (2013), Wang et al show that by tuning the ground state level anti crossing of NV-centres, nearby $^{13}$C nuclear spins inside the diamond can be polarised efficiently. The same has been shown in "Bulk Nuclear Polarization Enhanced at Room-Temperature by Optical Pumping", Phys Rev Lett 111, 057601 (2013) by Fischer et al for the excited state level anti-crossing of the NV centre. The relevant portions of this publication are incorporated into the present disclosure by way of reference.

Polarisation Transfers Employing at Least Two Electron Spins

In some methods according to the invention the transfer step is performed by an interaction involving at least two electron spins of the polarisation structure and one nuclear spin of a particle. This mechanism (for example when used in the cross effect and thermal mixing DNP protocols) is based on allowed transitions of several electron spins and a nuclear spin involving a homogeneously or inhomogeneously broadened EPR line. The broadening of the EPR line allows a simultaneous flip of two or more electron spins and a nuclear spin to be energy conserving and enables transfer of the electron spins' polarisation to the nuclear spins with the correct microwave irradiation.

Preferably, electron spins of mediator electrons are used for enhancing the interaction between the colour centre and nuclear spin. The mediator electrons preferably are located outside the polarisation structure. A preferred mediator electron spin according to the invention is any free electron spin, for which the distance to the nuclear spin is comparable or shorter than the distance of the colour centre to the nuclear spin. In some embodiments of the invention, the mediator electron spins are defects inside the polarisation structure. Diamond lattices, for example, typically contain electron spin impurities, mainly substitutional Nitrogen (P1) defect centres. These P1 centres can be more densely packed and closer to the diamond surface compared to colour centres. However other defects with long spin lifetime can be present, such as phosphor and vacancy aggregates.

In other embodiments of the invention, the mediator electron spins are free electron spins located outside the polarisation structure on the structure's surface. The surface of a diamond, for example, contains many dangling chemical bonds which contain free electrons. Additionally, free radicals can be attached to the polarisation structure such as a diamond, including but not limited to mono- or biradicals or metal ions. A partial list includes: Gadolinium, TRITYL, TEMPO, BDPA, BTnE, TOTAPOL. Preferably, such spins are photostable. In yet other embodiments, the mediator electron spins are not attached to the polarisation structure. In such embodiments, the mediator electron spins can for example be part of a solution or suspension in which the particles are dissolved or suspended. The mediator electron spins can for example be free radicals in the solution or free electron spins which are part of the particles. The mediator electron spins may or may not be polarised in the interaction, depending on the specific method.

In one preferred method, the mediator electron spins are driven at a non-resonant frequency compared to the polarisation structure's electron spins and nuclear spins. Taking as an example the NOVEL DNP protocol for polarisation transfer from the electron spins of the polarisation structure to nuclear spins, the electron spins of the polarisation structure and the nuclear spins are driven by microwave and/or RF fields so that their Rabi and Larmor frequency match. The mediator electron spins will be driven so that their effective Rabi frequency will be detuned from the frequency of the matching electron spins of the polarisation structure and the nuclear spins. This detuning turns the polarisation transfer from electron spins of the polarisation structure to the electron spin of the mediator into a virtual transition. This virtual transition, combined with the virtual polarisation transfer from the electron spin of the mediator to the nuclear spin, induces an effective interaction between the electron spins of the polarisation structure and the nuclear spins. This effective interaction will be equal to the smaller of the dipolar interaction of the polarisation structure of the electron spin with the mediator electron spin and the interaction of the mediator electron spin with the nuclear spin, minus approximately one order of magnitude. In many configurations it is achievable that this increases the interaction between the colour centre and nuclear spin by two orders of magnitude or even more. In this embodiment, the mediating electron spins are not polarised by the polarisation process.

In another preferred method, the polarisation transfer from an electron spin of the polarisation structure to a nuclear spin of the particle occurs in two steps such that first the mediator electron spin is polarised by the electron spin of the polarisation structure and then the nuclear spin is polarised by the mediator electron spin. This method can be very effective in cases where the interaction between the colour centre and electron spin is significantly larger than the interaction between the electron spin and nuclear spins, and the electron spin relaxation time is longer than the transfer time to the nuclear spins. This method can be especially effective in polarisation of a solid.

In another preferred method an electron spin of the polarisation structure and a mediator electron spin are brought into resonance with a nuclear spin of the particle, thus achieving a "triple Hartmann Hahn" condition. In this case, the polarisation can be transferred to both the mediator electron spin and the nuclear spin, thereby significantly enhancing the overall polarisation transfer rate. As the mediator electron spin and the nuclear spin are strongly coupled, the transferred polarisation can alternate between them. However, because it is achievable that the polarisation of the nuclear spin can diffuse on a timescale faster than the polarisation transfer, whenever a polarisation is transferred to the nuclear spin, the polarisation will with a high probability leave the immediate vicinity of the mediator electron spin and the electron spin of the polarisation structure from which the polarisation originated, and will therefore not transfer back the polarisation.

Preferably the cross effect is performed between an electron spin of the polarisation structure, a mediator electron spin and a nuclear spin in a particle. In certain embodiments, the spin of the mediator electron is driven in a way that its effective Rabi frequency is detuned from the effective Rabi frequency of the electron spin of the polarisation structure by the average Larmor frequency of the nuclear spin. This allows a simultaneous flip of all three spins while conserving energy, and a more efficient polarisation.

In certain methods according to the invention the mediating electron spins are decoupled from all other electron spins (including other mediating electron spins). Flip-flop interactions between close mediator electron spins can decrease the effective interactions between the colour centres and the nuclear spin induced by the mediating electron spins. In one preferred method for reducing the interaction between electron spins, this is achieved by a Lee-Goldburg decoupling (see Lee, Moses, and Walter I Goldburg "Nuclear-magnetic-resonance line narrowing by a rotating rf field." *Physical Review* 140.4A (1965): A1261): the microwave electromagnetic field used for driving the electron spins is applied at a detuned frequency from the electron spin bare Rabi frequency. The relevant portions of this publication are incorporated into the present disclosure by way of reference. Matching this detuning with the microwave amplitude times square root of two effectively decouples between the electron spins, with the condition that the microwave amplitude is one order of magnitude larger than the electron spin dipolar interaction. In certain embodiments, a second microwave or RF field is added to tune the effective Rabi frequency of the electron spins.

Polarisation Via Polarisation Structure Composed of Randomly Oriented Nanoparticles Many colour centres exhibit a ground and excited state splitting between some of the energy levels even in zero magnetic field ("zero-field splitting"). Due to the large zero-field splitting inherent in the colour centres (and the large magnetic moment of the electron in a low magnetic field), this causes the energy levels of the colour centre spin to be distributed over a large range of possible values, depending on the angle of the colour centre axis from the magnetic field orientation. The range of variation of the energy levels is of the order of several Gigahertz. Thus, applying an external microwave field will resonantly couple only an exceedingly small fraction of the colour centre spins to the nuclear spins. Tuning the magnetic field to a specific value corresponding to the energy gaps between the NV spin levels is also not feasible. Moreover, in an external magnetic field, additional limitations concern the optical polarization of most colour centre spins, such as the NV spin in diamond. In particular, in a high external magnetic field, the NV spins will be initialized to different states depending on their angle with the external magnetic field, thus resulting in a small net polarization. An additional problem posed in the case of a low magnetic field is that the external microwave field is randomly oriented in regards to the crystal lattice orientation, causing a large deviation in the colour centre's effective Rabi frequency.

The two regimes of the magnetic field strength in the present invention are defined as the high magnetic field regime and low magnetic field regime. The high magnetic field regime is defined as the regime where the colour centre Larmor frequency is larger than the zero-field splitting. For NV centres this corresponds to magnetic fields larger than 0.1 T, more preferably larger than 0.2 T, even more preferably larger than 0.4 T. The low magnetic field regime is defined in the opposite fashion (zero field splitting of the colour centres is larger than the Larmor frequency). For NV centres this corresponds to magnetic fields smaller than 0.1 T, more preferably smaller than 0.05 T.

A first solution to the problem of polarisation transfer with random orientation is a suitably designed microwave frequency sweep, enabling the involvement of multiple colour centre orientation in the polarization transfer.

In the context of the present invention, a microwave frequency sweep is defined as a change in time of the microwave frequency across a given range. This change can be continuous, with a constant or varying speed, or alternatively using discrete frequencies, with a constant or varying gap between the discrete frequencies. Alternatively, the microwave frequency can remain constant, while varying the strength of the external magnetic field. As a variation of the microwave frequency or the external magnetic field are interchangeable, both will be addressed as a microwave frequency sweep. The insignificant differences between microwave and external magnetic field sweeps, such as the change in the nuclear Larmor frequency, will be noted and explained in the text.

For a frequency sweep to be effective, four conditions have to be met:

1. A large percentage of colour centre orientations have to be included in the frequency sweep
2. It should be possible to efficiently optically polarize most, if not all, the colour centres involved in the frequency sweep
3. The frequency sweep should enable effective polarization transfer from the involved colour centres to the surrounding nuclear spins. This requires the frequency range in the sweep to be sufficiently small and/or the sweep velocity to be large, while allowing effective transfer
4. The duration of the frequency sweep should be preferably less than 1 ms, more preferably less than 100 µs, more preferably less than 10 µs, to allow numerous cyclic repetitions of optical pumping and polarization transfer steps within the polarization lifetime of the nuclei Point 1 requires the frequency sweep to cover a wide range of colour centre orientations, while points 3,4 require the frequency range to be narrow. Therefore, the polarization sweep needs to include a small frequency range, which includes a wide range of colour centre orientations that can also be efficiently optically polarized.

In the high magnetic field regime, the principal quantization axes of the colour centres are determined by the external magnetic field orientation. The energy gap between the colour centre's energy levels are determined by the angle between the crystal orientation and the magnetic field orientation. This angle determines the zero field splitting value along the magnetic field quantization axis, which will be defined as the misaligned zero field splitting. Preferably, the microwave frequency sweep is performed in frequency ranges where the misaligned zero field splitting varies slowly. This corresponds to angles near 0 degrees (crystal axis along or opposite the magnetic field orientation) or 90 degrees (crystal axis perpendicular to the magnetic field orientation). The 0 degrees angle will be termed as parallel crystal axis and the 90 degree will be termed as perpendicular crystal axis. Preferably, the frequency sweep encompasses angles no larger than 20 degrees deviation from parallel or perpendicular respectively, more preferably maximally 10 degrees deviation, or 5 degrees deviation. Due to the quadratic nature of the zero-field splitting in NV centres, there is no difference if the crystal axis is aligned along or opposite the magnetic field orientation. For NV centres, the zero field splitting for parallel crystal axis is 2880 MHz. The variation in the misaligned zero field splitting is 130 MHz for 10 degrees deviation and 600 MHz for 20 degrees. For perpendicular crystal axis the misaligned zero field splitting is −1440 MHz. The variation in the misaligned zero field splitting is around 130 MHz for 10 degrees deviation and around 500 MHz for 20 degrees. Remarkably, both the parallel crystal axis and perpendicular crystal axis allow efficient optical pumping of the NV centre spin. For the parallel crystal axis, the NV centre spin is pumped into the $m_s=0$ state, which corresponds to a polarization of 100%. For the perpendicular crystal axis, the NV centre spin is pumped into the $\{m_s=+1,-1\}$ subspace. As the polarization is performed between the $m_s=0$ and $m_s=+1$ or $m_s=-1$, states, this corresponds to an average of 50% polarization. In both cases, for 10 degrees deviation the optical polarization should be multiplied by 0.94 (average 0.97 for 0-10 deviation range), and for 20 degrees by 0.77 (average 0.88 for 0-20 deviation range). Thus, the achieved optical polarization is 2-3 orders of magnitude larger than the electron polarization at room temperature and similar magnetic field strengths.

In the low magnetic field regime, the quantization axis of the colour centre is given by its zero field splitting orientation (crystal orientation). Again, the energy gap between the colour centre's energy levels are determined by the angle between the crystal orientation and the magnetic field orientation. This angle determines the magnetic field value along the magnetic field quantization axis, which will be defined as the misaligned Larmor frequency. In this regime, the misaligned Larmor frequency value range can be much smaller than the misaligned zero field splitting range in the high magnetic field regime. Thus, a larger angle deviation can be included in the microwave frequency sweep. Optical initialization in the low magnetic field regime is efficient for all crystal axis orientations, as long as the magnetic field value does not correspond to the excited state level avoided crossing value of 0.05 T. In order to overcome the random angle between the applied microwave field and the crystal orientation, preferably the microwave field is applied in parallel to the external magnetic field. Thus, all colour centres with the same angle from the magnetic field (and same misaligned Larmor frequency) will have the same angle from the driving microwave field, and could be tuned to the same Rabi frequency.

The microwave frequency sweep can be achieved by changing (1) the external magnetic field (2) sweeping the microwave frequency while using low Q-factor resonators (3) sweeping the microwave frequency while tuning the coupling to a high Q-factor resonator to lower the effective Q-factor (4) changing the position of the nanodiamond ensemble in relation to the magnet, such that the magnetic field at the nanodiamond ensemble position changes.

A second solution to the random colour centre orientation is the use of a detuned microwave driving in the high magnetic field regime, efficiently narrowing the energy gap differences between colour centres of different orientations. In the context of the present invention, a detuned microwave driving is defined as a microwave driving with a frequency which differs from the energy gap of between any of the energy levels of the colour centre by at least 50 MHz, but is no further than 50 MHz from half the energy difference between the $m_s=+1,-1$ states. This arrangement can be used to produce interaction between the $m_s=+1,-1$ states of the colour centers without populating significantly the $m_s=0$ state resulting in a much weaker dependence of the scheme on the orientation of the diamond.

In the high magnetic field regime, preferably a detuned microwave driving is applied. Preferably the frequency of the detuned microwave driving is chosen to match the Larmor frequency of the colour centres, plus corrections from the misaligned zero field splitting. Preferably this value is no further than 100 MHz from half the energy splitting between the $m_s=+1,-1$ levels, more preferably no further than 50 MHz, more preferably no further than 10 MHz, most preferably, no more than the Rabi frequency squared divided by the detuning from the $m_s=0$ to $m_s=+1$ transition. The corrections from the misaligned zero field splitting (second order corrections) are on the order of only tens of MHz for all orientations, compared with several GHz for the energy gap dependence on the misaligned zero field splitting itself. Thus, with detuned microwave driving, many more orientations are involved in polarization transfer for a specific microwave frequency, and the sweep range for involving large angle deviation is reduced considerably. For 10 degree deviation from the perpendicular/parallel crystal axis, the frequency range is only 10 MHz, compared with 130 MHz for non-detuned driving. For 20 degree deviation it is only 45 MHz instead of 500 MHz. The detuned microwave driving creates an interaction between the $m_s=+1,-1$ states of the colour centre, through virtual transitions to the $m_s=0$ state. Thus, in the detuned driving case, the polarization transfer involves transitions between the $m_s=+1$ and $m_s=-1$ states of the colour centre. Preferably, the microwave detuned driving corresponds to a Rabi frequency of at least 20 MHz for the colour centre, more preferably at least 40 MHz, more preferably 60 MHz, more preferably 80 MHz.

Further Preferred Features and Applications of the Invention

Preferably, the optical pumping step and the transfer step are repeated cyclically. After the optical pumping of the electron spins of the polarisation structure, the thus obtained polarisation can be transferred to the nearby nuclear spins of the particles. By repeating the optical pumping step and the transfer step, it is achievable to polarise most, preferably all nuclear spins in close proximity to the polarisation structure.

Preferably, a pause after each cycle allows for some of the particles to diffuse away from the polarisation structure, and unpolarised nuclear spins to take their place. Advantageously, the diffusion of particles away from the polarisation surface may occur spontaneously, and no application of alternating electromagnetic fields may be required during the diffusion of the particles. By cyclically repeating the optical pumping step, transfer step and pause, the invention permits the polarisation of most, preferably all of the particles. In preferred embodiments of the invention the polarisation of the hyperpolarised particles is greater than 1%. For example, 100 particles, each with one nuclear spin, with 51 spins in the preferred direction and 49 in the opposite direction would have a polarisation of 2%. Preferably the nuclear spin polarisation is greater than 0.1%, more preferably greater than 1%, more preferably greater than 10%, more preferably greater than 30%, and most preferably greater than 50%.

In certain embodiments, especially when the diffusion coefficient is extremely small (e.g. in polarizing solid particles in air), the polarisation is propagated between nuclei in the particle via dipolar interactions. Yet, the invention also encompasses embodiments in which the polarisation is propagated between nuclei of separate particles.

The invention makes it possible to produce a wide range of hyperpolarised particles at temperatures higher than 70 K, more preferably higher than 270 K, most preferably at room temperature. It is an achievable advantage of such temperatures that they do not require expensive cooling systems involving liquid helium, but can be achieved with liquid nitrogen, more preferably even with simple non-cryogenic cooling and most preferably even with no cooling at all. It is an achievable advantage o the invention that since the polarisation is produced not by thermodynamic electron spin equilibrium, this substantial increase in temperature does not correspond to a loss of maximal polarisation obtained.

In a particularly preferred method according to the invention, the particle(s) have a temperature higher than 273 K, more preferably room temperature. This has the advantage that the particles do not need to be melted after the polarisation. Thereby it can be avoided that a melting performed after the hyperpolarisation entail a significant polarisation loss before the particles can be put to a use, e. g. in NMR.

In some embodiments of the present invention hyperpolarised particles after partial or complete loss of their polarisation are re-hyperpolarised, preferably to be re-used. Such re-hyperpolarisation can be particularly convenient if it is performed at room temperature.

Preferably, one or more particles hyperpolarised according to the invention are used in a nuclear magnetic imaging (NMR) or magnetic resonance imaging (MRI) application. Hyperpolarised particles can for example contribute to achieving a better resolution in NMR imaging of e.g. crystal structures and proteins. It is an achievable advantage of the hyperpolarisation that even small amounts of the hyperpolarised particles can be detected by NMR imaging. Preferably, if used for NMR the molecules are first hyperpolarised according to one of the methods described herein and then imaged in an NMR or magnetic resonance imaging system. In certain embodiments the hyperpolarised molecules are used to increase the signal in an NMR application. In certain embodiments the hyperpolarised molecules can be added to a subject in vivo to enhance the contrast of an MRI image and highlighting specific processes. In certain embodiments, the hyperpolarised molecules are molecules which have a sufficiently long hyperpolarisation time and are involved in metabolic processes, including but not limit to [1-$^{13}$C] pyruvate, $^{13}$C-Enriched Bicarbonate, [1,4-$^{13}$C$_2$]fumarate, [1-$^{13}$C]lactate, [5-$^{13}$C]glutamine, [1-$^{13}$C]acetate, [2-$^{13}$C]-fructose, [1-$^{13}$C]succinate, [1-$^{13}$C]-α-ketoisocaproate, $^{13}$C-choline/$^{15}$N-choline and glucose derivatives ([1-$^{13}$C]glucose and [6,6-$^2$H$_2$]glucose). In certain embodiments, the hyperpolarised molecules are non-metabolic molecules under investigation for hyperpolarised imaging, such as the reporter probe 3,5-Difluorobenzoyl-L-glutamic Acid. In certain embodiments, the hyperpolarised molecules are nanoparticles, which exhibit very long relaxation times.

DESCRIPTION OF SPECIFIC EMBODIMENTS OF THE INVENTION

Microfluidic Channel
Experimental Setup

Figure 1:
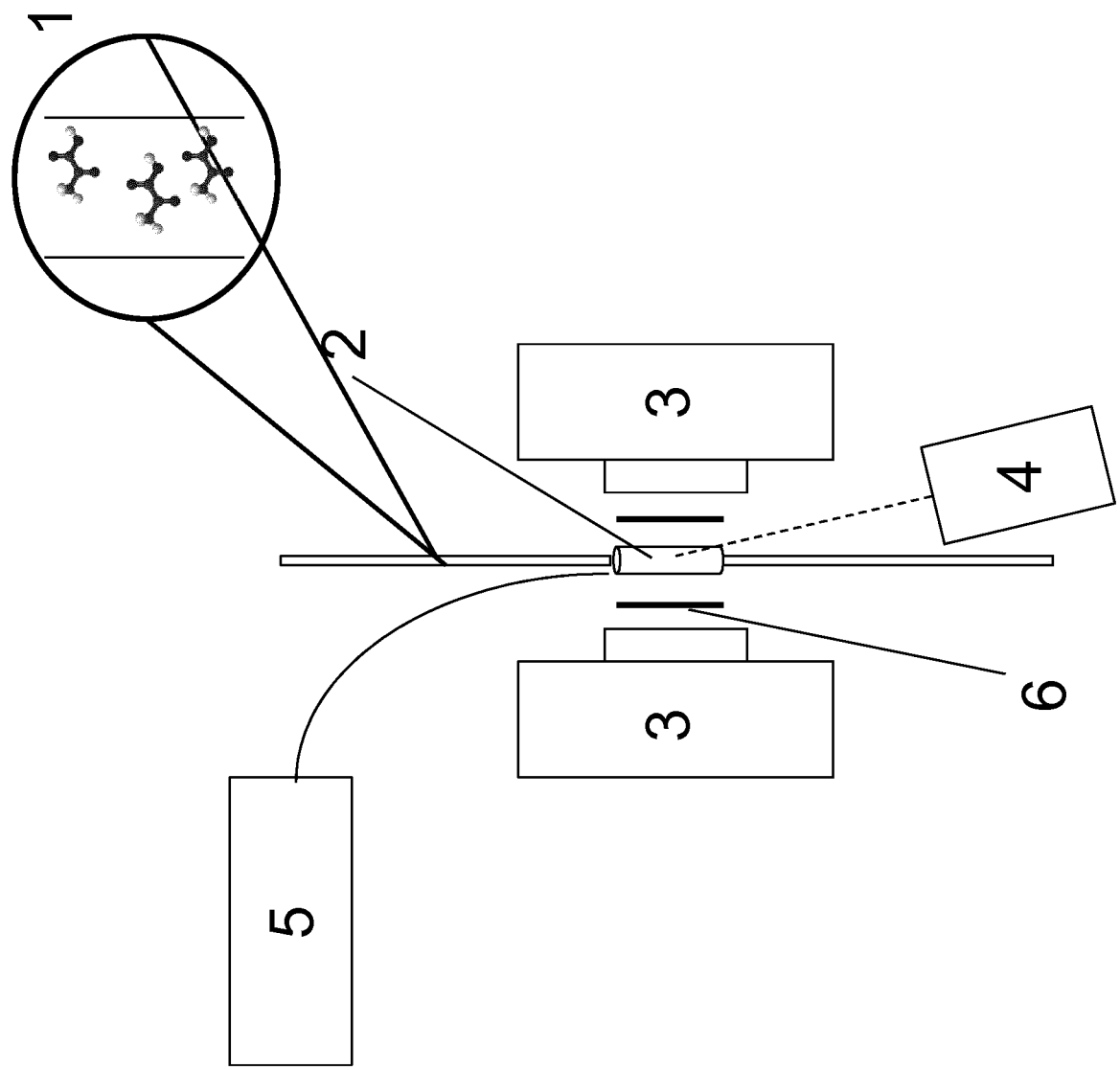
FIG. 1 shows the experimental setup with a microfluidic polarization structure in a conceptual representation.

FIG. 1 conceptually details the experimental setup with a solution of pyruvate particles 1 flowing through a microfluidic channel 2, placed in the magnetic field of an electromagnet 3. The microfluidic channel 2 contains multiple colour centres. A laser 4 serves to excite the colour centre electrons. A microwave source 5 and amplifier, in combination with a resonator 6 allows facilitation of polarisation transfer from the colour centre spins to the $^{13}$C nuclei in the pyruvate molecules.

The polarisation structure can be composed of different materials containing colour centres. While the experimental details below will be given for NV centres in a diamond substrate, the setup and polarisation transfer for other materials and colour centres are similar, e.g. for divacancies and silicon vacancies in silicon carbide or optically active defects in zinc-oxide or other wideband gap materials. The differences are only in the wavelength of the optical irradiation, the zero-field splitting and relaxation rates of the colour centre and the rate of polarisation achieved. The same protocols can be adapted with different parameters for optimizing polarisation depending on the colour centre and material.

Figure 2:
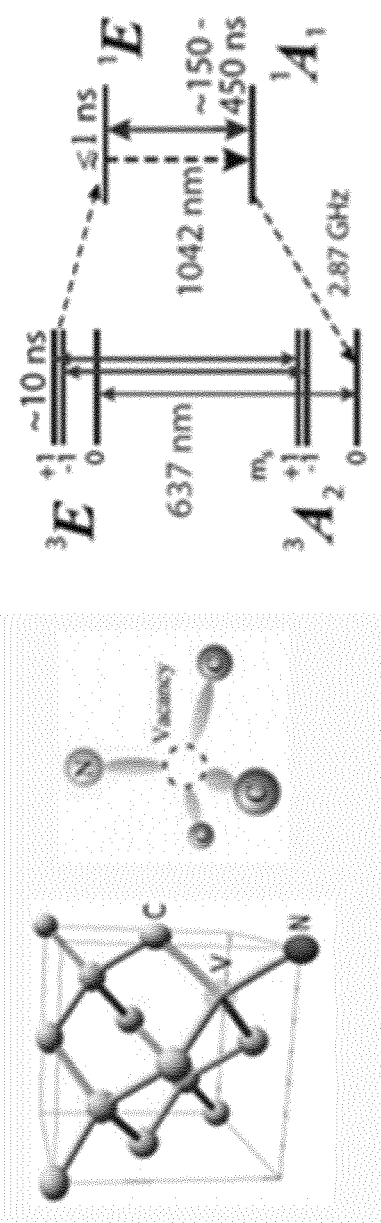
FIG. 2 depicts a nitrogen vacancy centre in a diamond lattice, and shows the relevant energy levels for the initialization and polarization.
Figure 3:
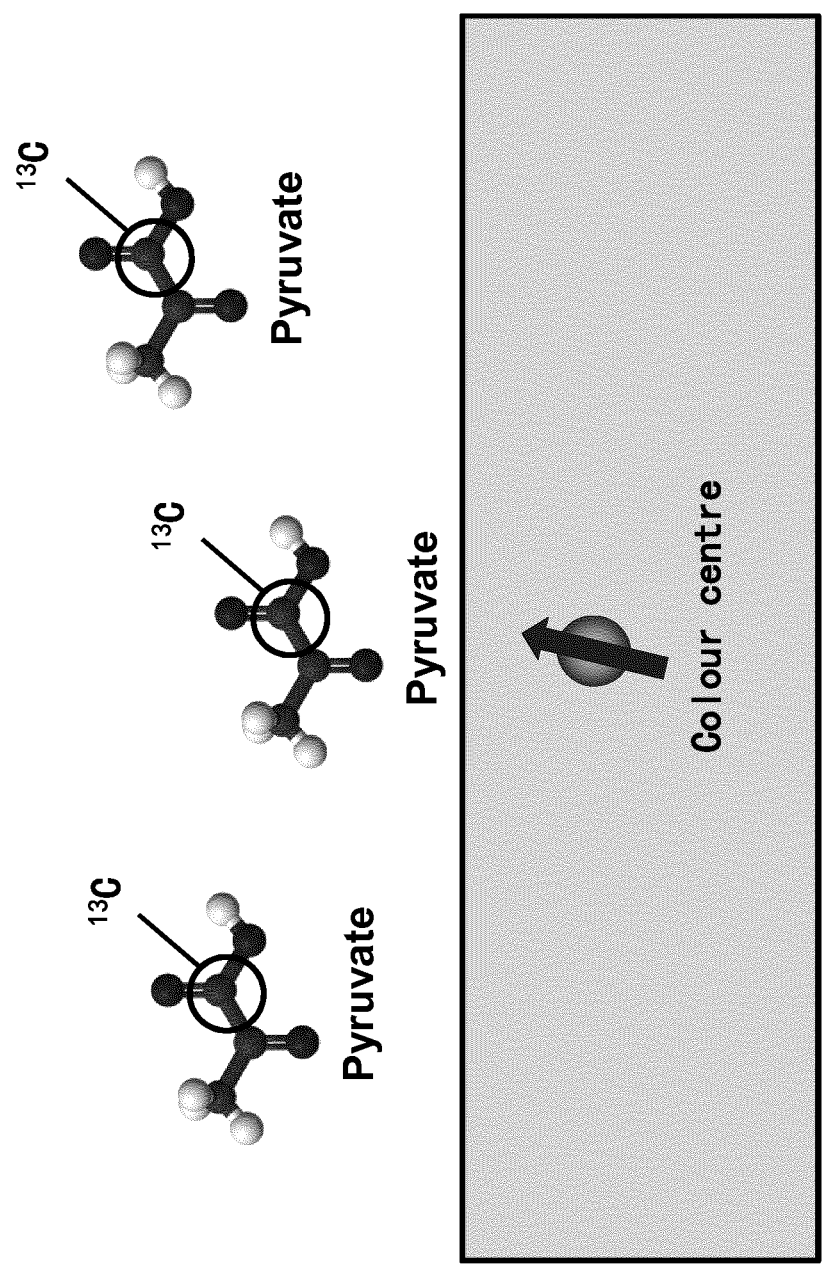
FIG. 3 shows a schematic of the interface between the polarization structure and the particles with the nuclear spins.

FIG. 2 illustrates the interaction interface between the colour centre spin and the particles in the solution containing nuclear spins.

Material

Diamond material for this protocol should contain NV centres close to the diamond surface. Material itself can be grown using CVD technique or HPHT method. NV centres close to the diamond surface can be introduced by injection of nitrogen gas during CVD growth or by implantation of nitrogen after the growth. In the latter case post-irradiation of sample can be employed to increase the formation yield of NV centres.

Inside the diamond layer approximately 20 nm from the surface, denoting the z axis as perpendicular to the diamond surface, the diamond should ideally contain one NV centre every 100 nm$^2$ the x,y dimensions. FIG. 2 depicts an NV centre in a diamond lattice, and the corresponding level structure.

Figure 4:
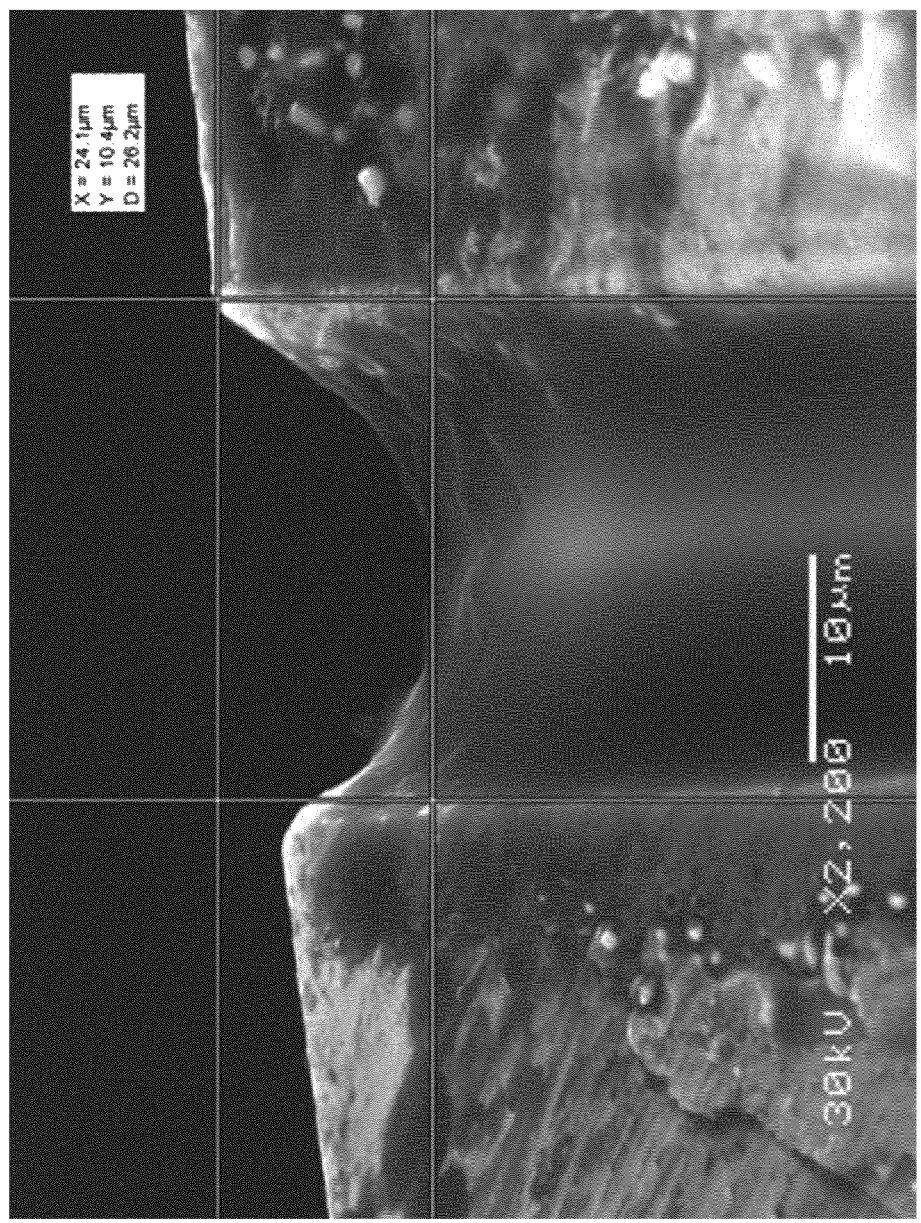
FIG. 4 presents an image of a microfluidic channel etched in a diamond containing NV centres.
Figure 5:
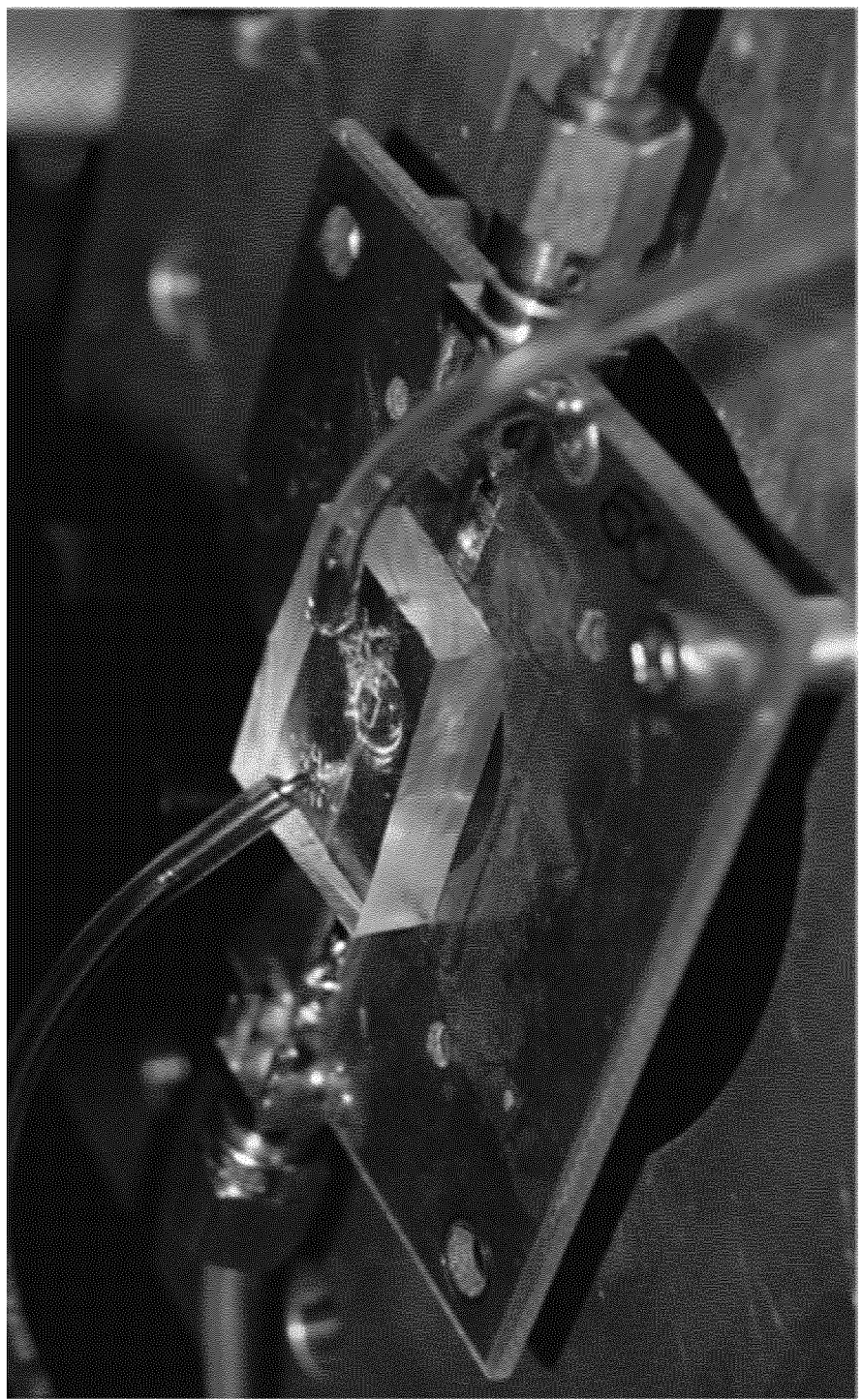
FIG. 5 presents the microfluidic channel enclosed with a PMMA covering.
Figure 6:
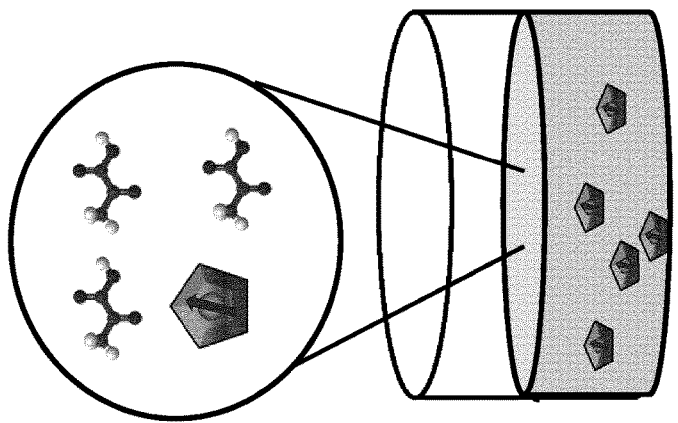
FIG. 6 presents three different possible configurations of the polarisation structure.
Figure 6:
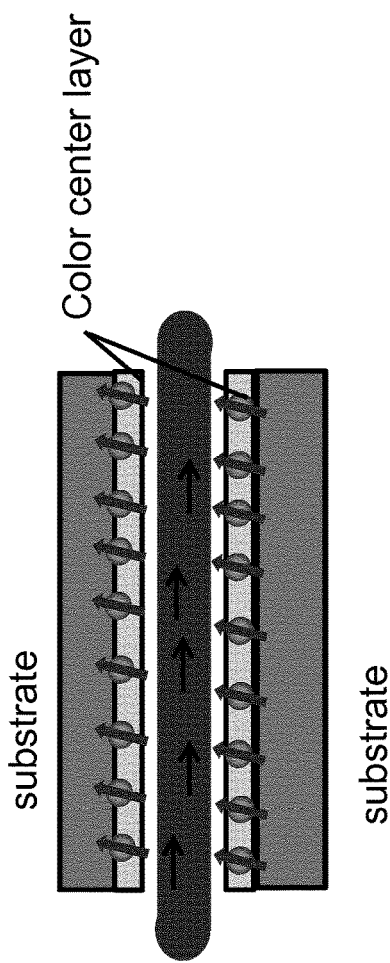
Figure 6:
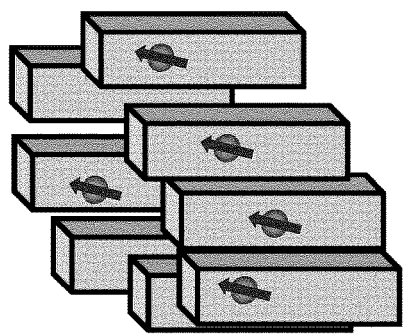

FIG. 4 depicts a microfluidic channel in a diamond, which can then covered by e.g. a Poly(methyl methacrylate) (PMMA) layer to create a closed structure (see FIG. 5).

For silicon-carbide, the crystal can be grown by sublimation techniques. The colour centres can be generated by irradiation with neutrons or electron (see for example Kraus, H et al (2014) Room-temperature quantum microwave emitters based on spin defects in silicon carbide, Nat Phys 10, 157-162; The relevant portions of the publication are incorporated into the present disclosure by way of reference.)

Solution Properties

Many different solvents can be used in the solution. Pyruvate could be dissolved in a mixture of water and glycerol, for example, the concentration of the two solvents determining the pyruvate self-diffusion coefficient.

Polarisation of Electron Spin

Electron spins associated with NV centres can be polarised either by the application of short laser 4 pulses, or by continuous irradiation. Optical pumping is achieved by excitation of the NV centre into an excited electronic state. The decay of this state occurs predominantly into the $m_s=0$ level of the ground state. Several cycles of excitation and decay produce a >95% polarization of the NV centre.

A similar spin-selective recombination by optical excitation and decay through a metastable state happens for colour centres in silicon-carbide (e.g. to the $m_s=0$ state in divacancies) and in the other host materials mentioned above.

Dynamical Polarisation Transfer from Electron Spin to Nuclear Spin

A proposed experimental realization of a DNP protocol for the polarisation transfer is achieved by establishing a Hartmann-Hahn condition between the electron and nuclear spin. This is achieved by driving the electron spin transitions between $m_s=0$ and $m_s=-1$ state by means of a microwave field whose intensity is chosen to match the energy difference between dressed electronic spin eigenstates and the nuclear spins in an external magnetic field.

The dynamics of the NV electronic spin and an additional nuclear spin, in the presence of a continuous driving microwave field have been theoretically analysed in Cai, J M et al, "Diamond based single molecule magnetic resonance spectroscopy", New Journal of Physics, 2013, 15, 013020, and the article's supplementary information; the relevant portions of the publication and the supplementary information are incorporated into the present disclosure by way of reference. The Hamiltonian describing the NV centre electronic $m_s=0, -1$ states and an additional $^{13}$C nuclear spin, in the presence of an external magnetic field B and a resonant microwave field is $$H = \Omega \sigma_z \otimes 1 + \gamma_N 1 \otimes |B_{eff}|\sigma_z + \gamma_N A_{hyp} \sigma_x \otimes (\sin\theta\sigma_x + \cos\theta\sigma_z) \quad (1)$$

where $\Omega$ is the Rabi frequency of the driving field and $\sigma$ are the spin-1/2 operators, defined in the microwave-dressed basis $$|\pm\rangle = \frac{1}{\sqrt{2}}(|0\rangle \pm |-1\rangle)$$

for the electronic basis, and in the $(|\uparrow_{z'}\rangle, |\downarrow_{z'}\rangle)$ basis for the nuclear spins, where z' is defined along the direction of $B_{eff}$. $B_{eff}$ is an effective magnetic field and is given by $B_{eff}=B-(\frac{1}{2})A_{hyp}$, where $A_{hyp}$ is the hyperfine vector which characterises the coupling between the two spins. In equation (1), $\gamma_N$ is the gyromagnetic ratio of the nuclear spin and $\cos\theta = \hat{h}\cdot\hat{b}$, where $\hat{h}$ and $\hat{b}$ are the directions of the hyperfine vector $A_{hyp}$ and the effective magnetic field $B_{eff}$, respectively. The first two terms in the Hamiltonian form the energy ladder of the system ($\Omega$ for the dressed NV spin, and $\gamma_N|B_{\it eff}|$ for the Larmor frequency of the nuclear spin), whereas the last two terms are responsible for electron-nuclear spin interaction. Here, the former represents mutual spin-flips, or coherent evolution of the electron-nuclear pair, and the latter is the nuclear spin dephasing caused by electron flips. When the driving field is adjusted properly, an energy matching condition (known as the "Hartmann-Hahn condition") given by $$\omega = \gamma_N |B_{\it eff}| = \gamma_N |B - (1/2) A_{hyp}|, \quad (2)$$

can be engineered, equalising the first two terms in Hamiltonian (1). Then, the coupling term in the Hamiltonian becomes dominant, and the time evolution of the system is a coherent joint evolution of the electron nuclear pair. For instance, starting in the $|+,\downarrow\rangle$ state, the system evolves according to $|\Psi\rangle = |+,\downarrow\rangle \cos(Jt) + |-,\uparrow\rangle \sin(Jt)$, with J given by $$J = \frac{1}{4} \gamma N |A_{hyp}| \sin\theta. \quad (3)$$

Thus, at time $t=\pi/2J$ the two spins become maximally entangled, and after a $t=\pi/J$ a full population transfer occurs and the states of the two spins are in effect 'swapped'.

Figure 7:
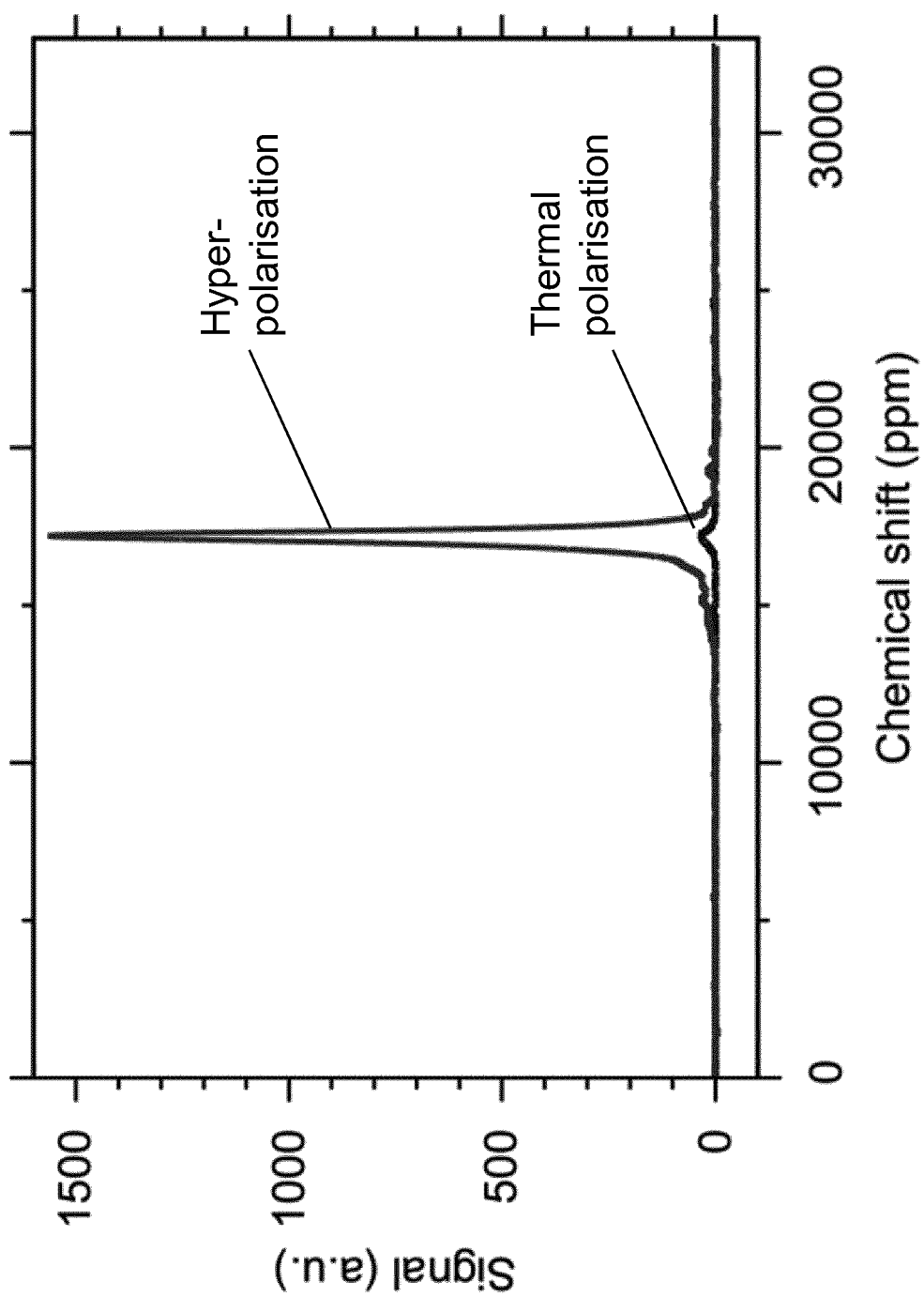
FIG. 7 shows the nuclear polarization achieved in a bulk diamond (2×2×1 mm) using the NOVEL protocol. The polarization is observed with a single-shot read out in an NMR scanner.

In the NOVEL sequence, a short microwave pulse at the electron spin frequency is first applied in order to rotate the spin to the X-Y plane (e.g. to the $|+\rangle$ state), termed a "$\pi/2$ pulse". The resonant microwave frequency described above is than applied, with a $\pi/2$ phase shift from the $\pi/2$ pulse. This resonant microwave pulse is termed the "spin locking pulse". A spin locking pulse of length 10-100 µs would efficiently transfer the polarization to the nuclear spins in the ensemble. FIG. 7 shows the hyperpolarisation of $^{13}C$ nuclear spins inside the diamond achieved via the NOVEL sequence, and compare with thermal polarisation.

However, for polarising nuclear spins in a solution, the molecular motion has to be taken into account, causing time-varying terms in the Hamiltonian. In a change of notation, the time-varying Hamiltonian used to describe the coupled spin system in the secular approximation, similar to eq. (1) is given by $$H(t) \propto \Omega \sigma_z^e + \gamma_N B_{\it eff}(t) \cdot \sigma^N - \sigma_x^e [A(t) \cdot \sigma^N] \quad (4)$$

where A(t) is the hyperfine vector, $B_{\it eff}(t) = B - 0.5/\gamma_N A(t)$ is the effective magnetic field and $\gamma_N$ is the nuclear gyromagnetic ratio, S the NV centre spin operator and σ the nuclear spin operator vector. A(t) stems from the fluctuating position of the nuclear spin r(t) relative to the NV centre. Specifically, A(t) and r(t) are related by $$A(r) = -\frac{\hbar \mu_0 \gamma_e \gamma_N}{4\pi |r|^3} (3\hat{r}_x \hat{r}_z, 3\hat{r}_y \hat{r}_z, 3\hat{r}_z^2 - 1),$$

as usual.

Figure 8:
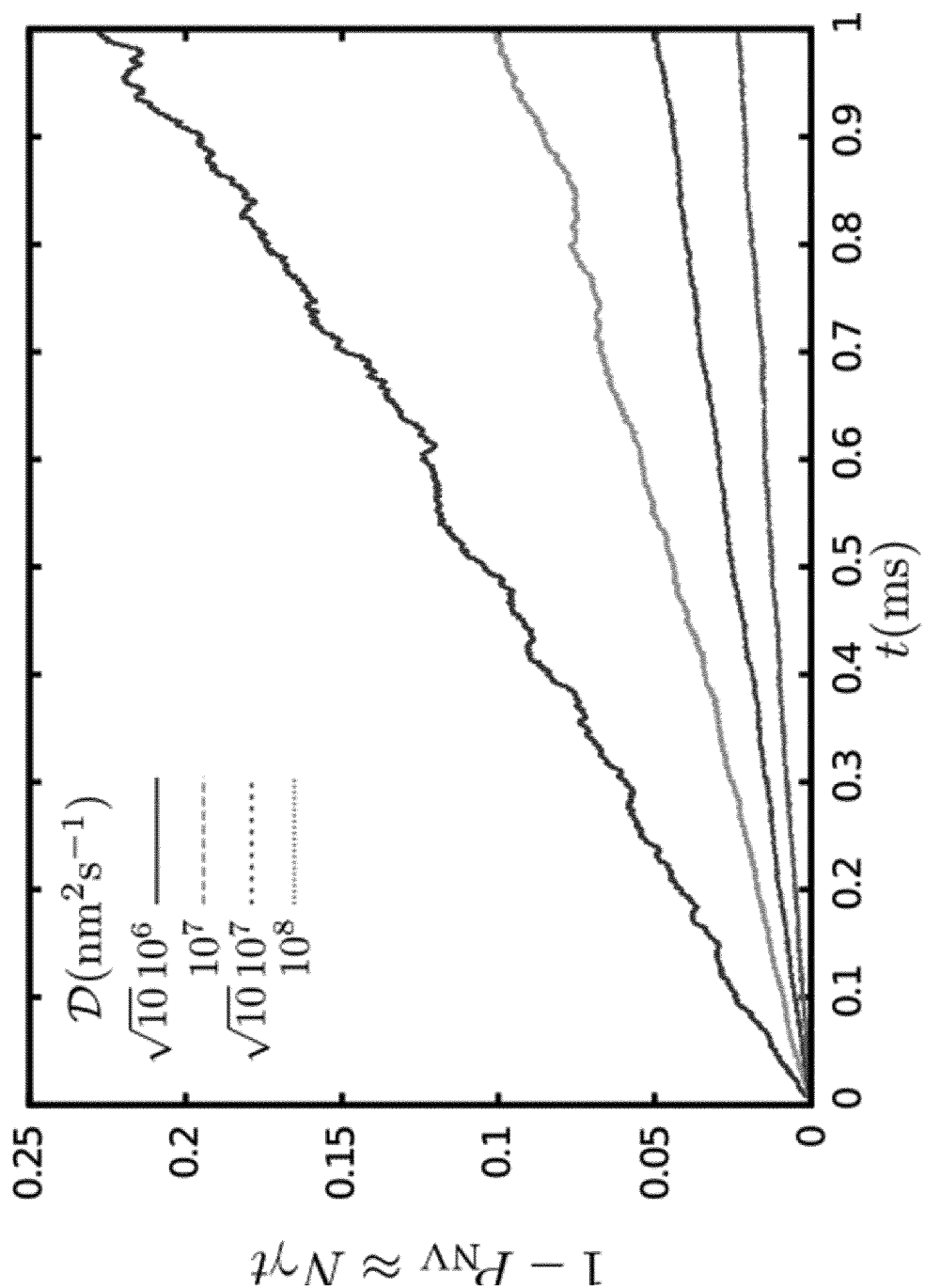
FIG. 8 shows the polarisation transfer per unit volume achieved per time, with dependence on the diffusion coefficient.

To analyse the efficiency of the polarisation transfer via resonant conditions in the presence of molecular motion, we simulate the Hamiltonian of eq. (4) by a Monte-Carlo simulation. The molecular motion of the particle is calculated by the Ito equations (details of the method provided in C W Gardiner. *Stochastic methods*. Springer-Verlag, Berlin-Heidelberg-New York-Tokyo, 1985; the relevant portions of this publication are incorporated into the present disclosure by way of reference.) The coupling of the nuclear spin in the particle to the NV is then calculated at very small intervals (under 10 nanoseconds). The solution to the Liouville-von Neumann equation, $$i\hbar \frac{\partial \rho}{\partial t} = [H, \rho],$$

with the time-dependent Hamiltonian of eq (4) is obtained via a Runge-Kutta method (for details, see e.g. Press, W et al (2007), "Section 17.1 Runge-Kutta Method", Numerical Recipes: The Art of Scientific Computing (3rd ed.), Cambridge University Press; The relevant portions of the publication are incorporated into the present disclosure by way of reference.) As no coherent effects involving several spins are expected in the parameter range of interest, and the nuclear interaction of the moving particles is negligible, the polarisation transfer rate can be extended to numerous particles with nuclear spins in the region of interest. FIG. 8 shows the polarisation transfer dependent on time for a NV centre 5 nm from the diamond surface, interacting with the nuclear spins in a (5 nanometer)$^3$ box external to the diamond. Different diffusion coefficients are plotted in FIG. 8, and as can be seen, the polarisation transfer rate via resonant coupling dramatically increases for smaller diffusion coefficients.

Figure 9:
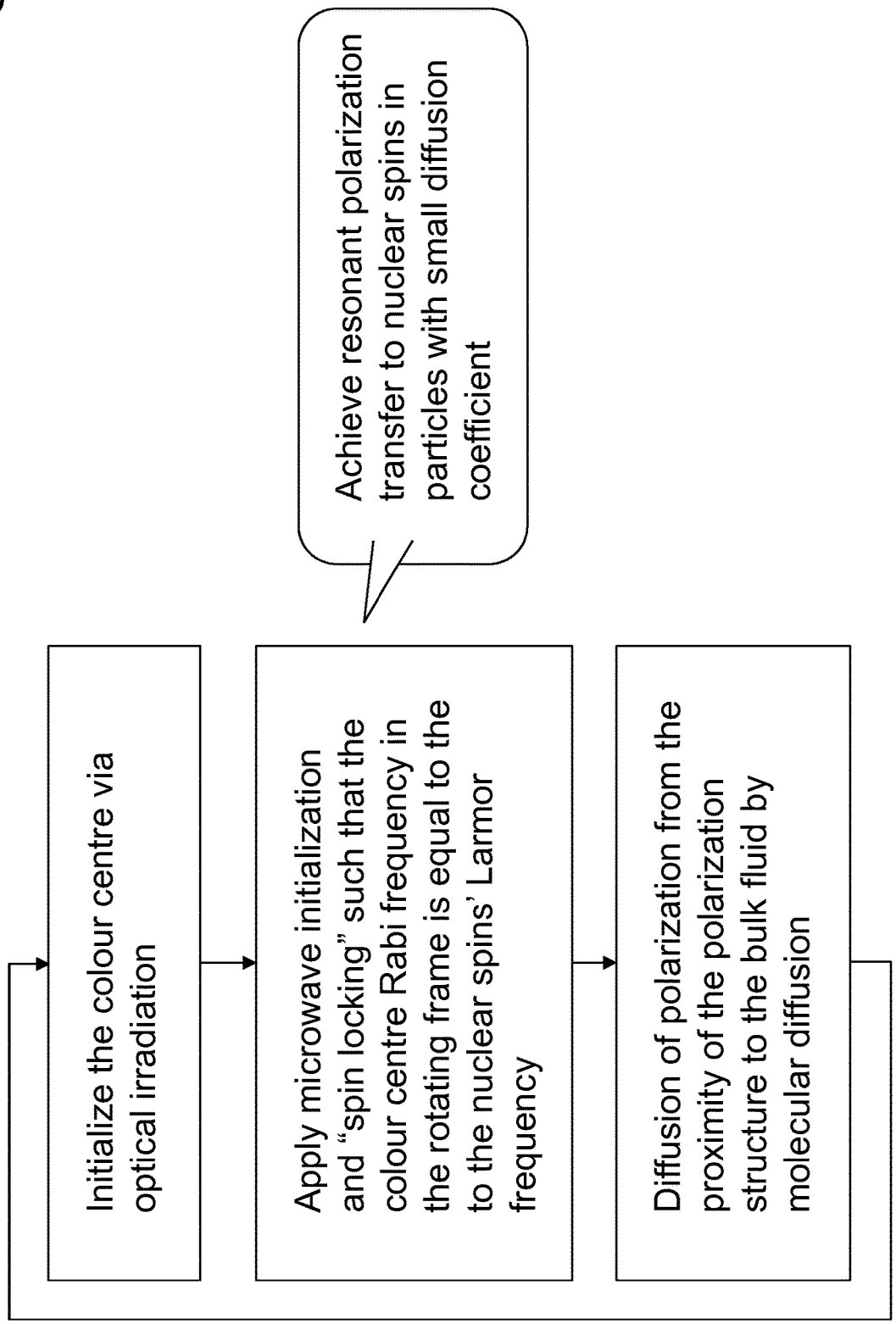
FIG. 9 illustrates the sequence of the polarisation.

Thus, the polarisation method is summarized in FIG. 9.

As many other colour centres in other materials (e.g. silicon vacancies in silicon carbide) exhibit the same or similar photodynamics and Hamiltonian, the polarisation transfer will be achieved by the same protocols, with modifying the microwave drive frequency to the corresponding resonance (e.g. due mainly to a different zero field splitting).

Mediating Electron Spins

As mediating electron spins external to the polarisation layer, the diamond layer can be coated with TEMPO, Trityl radicals or other paramagnetic species. Alternatively, dangling bonds already on the diamond surface can be used as the mediating electron spins. In a third option, radicals can be added to the solution, to serve as mediating electron spins. Trityl radicals for example are typically used in dynamic nuclear polarisation setups, and can be used for mediating the polarisation transfer to further away nuclear spins.

Nanoparticles Suspended in a Solution

Another attractive setup for the polarisation structure is the use of nanoparticles suspended in a solution. While many elements are similar to the microfluidic channel setup, key differences, mainly dealing with the random orientation of the nanoparticles, will be highlighted below.

Experimental Setup

Figure 10:
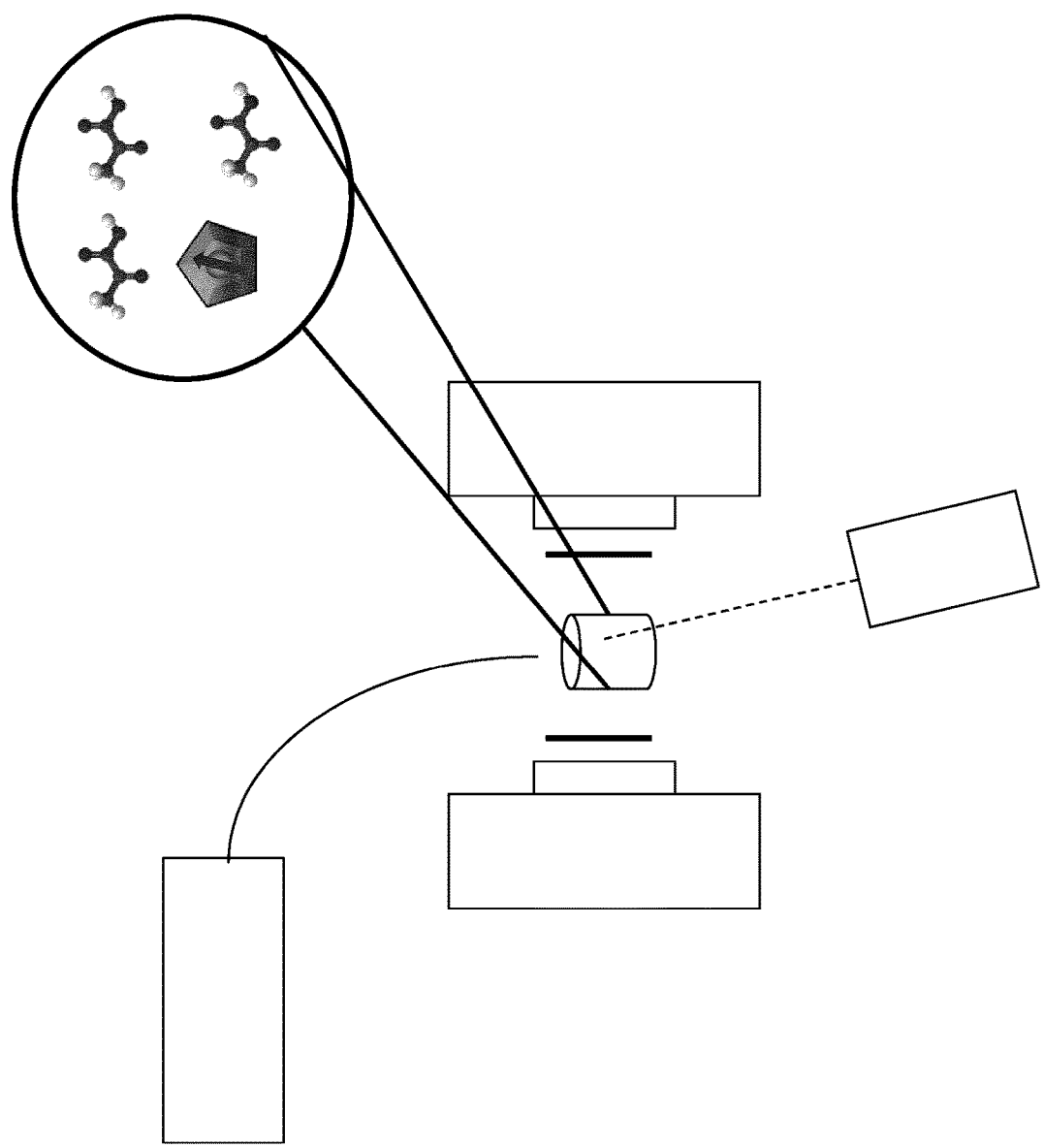
FIG. 10 shows the experimental setup with a polarization structure composed of nanoparticles in a suspension in a conceptual representation.

FIG. 10 conceptually details the experimental setup with a solution of pyruvate particles with a suspension of nanodiamonds containing NV centres. The solution is placed in the magnetic field of an electromagnet. A laser serves to excite the colour centre electrons. A microwave source, in combination with a resonator allows facilitation of polarisation transfer from NV centre spins to the $^{13}C$ nuclei in the pyruvate.

Diamond Material

The nanodiamonds are preferably produced by high-pressure high temperature (HPHT) method. For the direct polarisation of external spins via NV centres, ultra-small nanodiamonds, i.e. diamonds with volume between 1 nm$^3$ and 1000 nm$^3$, are preferable, though nanodiamonds with diameter up to 50 nm or more are also possible. Polarisation transfer will be enabled by dipolar interactions between NV centre spins and external nuclear spins.

Polarisation of Electron Spin

Electron spins associated with NV centres can be polarised either by the application of short laser pulses, or by continuous irradiation. Optical pumping is achieved by excitation of the NV centre into an excited electronic state. For NV centres aligned in parallel to the magnetic field, the decay of this state occurs predominantly into the $m_s=0$ level of the ground state. Several cycles of excitation and decay produce a >95% polarization of the NV centre. For small deviations in the angle, the optical polarisation depends on the external magnetic field strength.

For weak magnetic fields, $\gamma_E B \ll D$, With $\gamma_E B$ denoting the electron Larmur frequency, D the zero field splitting (D=2.87 GHz), the optical polarisation will be very weakly affected by the angle between the NV crystal axis and the magnetic field. Thus, we expect high fidelity optical polarisation in this regime for all NV angles.

For strong magnetic fields ($\gamma_E B \gg D$), there is a stronger dependence on the angle. For given spherical angles $\theta$, $\varphi$, of the NV centre crystal axis in relations to the external magnetic field, the NV is initialized to the state $$|0\rangle_{\theta,\phi} = \cos\theta|0\rangle + \sin\theta\left[\frac{1}{\sqrt{2}}(-e^{i\phi}|+1\rangle + e^{-i\phi}|-1\rangle)\right]$$

For angle variations up to $\Delta\theta=10°$ from $\theta=0$, the optical polarization works extremely well, $|\langle 0|0\rangle_{\theta,\phi}|^2 > 0.97$. $\theta=\pi/2$, one gets $$|0\rangle_{\theta,\phi} = \left[\frac{1}{\sqrt{2}}(-e^{i\phi}|+1\rangle + e^{-i\phi}|-1\rangle)\right].$$

While the $|\pm 1\rangle$ terms oscillate very quickly in the strong magnetic field, the amplitude of the $|0\rangle$ state remains zero. Thus, on average we get a strong average polarization $P_{NV}=|\langle 1|\psi(t)\rangle|^2 - |\langle 0|\psi(t)\rangle|^2 \approx 0.5$. Moreover, unlike the usual case where $P_{NV}=0.5$, as $|\langle 0|\psi(t)\rangle|^2=0$, one can achieve 95% polarization with additional polarization cycles.

Dynamical Polarisation Transfer from Electron Spin to Nuclear Spin

The same simulations and methods applied in the microfluidic channel setup apply in the suspended nanodiamonds setup as well. The one key difference is the method used for achieving a resonance condition (e.g. Hartmann Hahn condition) for performing the transfer, detailed below.

Exchange of polarisation between optically pumped electron spin of NV centre and nuclear spins can be performed using several established dynamic nuclear polarisation protocols, in combination with our schemes based on Microwave frequency sweeps. For example, the integrated solid effect. Moreover, these protocols can be combined with the polarization sweep and the detuned driving scheme, for optimal polarization transfer. Most DNP protocols either involve interactions between electron spins or are based on two underlying physical mechanisms: fulfilling the Hartmann-Hahn condition and excitation of selective transitions. The DNP protocols differ in the configurations for achieving these conditions and by the usage of pulses or continuous waves. We will first detail the effective microwave frequency sweeps in nanodiamonds for the high magnetic field and low magnetic field regimes, and then describe the DNP protocols modified for combination with a microwave frequency sweep, and applied for the effective regimes in the nanodiamond ensemble.

For the above DNP protocols, the experimental setup is similar, with the differences being found in the specific choice of microwave frequency, the specific type of the frequency sweep (continuous or discrete), the specific choice of the pulse sequence and/or magnetic field strength. The same equipment can be used for all protocol examples detailed below, as they are performed in similar regimes.

In the high magnetic field regime, the main challenge in performing the frequency sweep is the very large deviations of the energy gap. Moreover, for many NV orientations, optical polarization not feasible. However, two angle ranges enable a short frequency sweep which includes a large portion of optically polarizable NV centres.

In the laboratory coordinate system, we define the z-axis to coincide with the applied magnetic field, and the NV to be placed at the origin of the coordinate system. In the laboratory frame the Hamiltonian of a single NV is then $$H''_{\text{eff}} = (\gamma_e B + \delta(\theta))S_z + D(\theta)S_z^2,$$

$$D(\theta) = \frac{D(1+3\cos(2\theta)) + 3E(1-\cos(2\theta))}{4},$$

$$\delta(\theta) = \frac{\gamma_e B G_1^2}{(\gamma_e B)^2 - [D(\theta)]^2} + \frac{G_2^2}{2\gamma_e B}$$

With $$G_1 = \frac{(D-E)\sin\theta\cos\theta e^{i\phi}}{\sqrt{2}},$$

$$G_2 = \frac{D + 3E + (E-D)\cos 2\theta e^{2i\phi}}{4}.$$

With $\gamma_E B$ denoting the electron Larmur frequency, D the zero field splitting (D=2.87 GHz), E the strain of the diamond (usually over 2 orders of magnitude smaller than D), and $\theta$ is the angle between the NV crystal orientation and the external magnetic field orientation. The range of the energy gap between the NV spin $|0\rangle$ level and $|\pm 1\rangle$ is approximately $\gamma_E B + D(\theta)$ (as $\delta(\theta)$ is roughly 2 orders of magnitude smaller), which contains a large uncertainty dependent on the angle as $D(\theta) \in [-(2\pi)1.43 \text{ GHz}, (2\pi)2.87 \text{ GHz}]$.

The energy gap varies slowly for $\theta=0$ or $\theta=\pi/2$. $\theta=\pi/2$ ($D(\theta)=-D/2$) is a particularly interesting case, as a microwave sweep corresponding to $\theta=\pi/2$ to $\theta=\pi/2-\Delta\theta$ corresponds to a solid angle of $4\pi \sin \Delta\theta$. For example, for $\Delta\theta=10°$, this area encompasses over 17% of the possible NV orientations (when taking into account the symmetry between $\theta$ and $\pi-\theta$).

For an NV in an orientation with angle $\theta$ from the external magnetic field, defining the x-axis so that the crystal orientation and magnetic field are on the x-z plane, the Hamiltonian of the NV centre spin can be written as $$H = \frac{2}{3}DS_z^2 - \frac{1}{3}DS_x^2 - \frac{1}{3}DS_y^2 + \gamma_e B\cos(\theta)S_z + \gamma_e B\sin(\theta)S_x.$$

Of important note is the fact that the zero-field splitting term does not differentiate between $m=+1, -1$ states. Therefore, the splitting between these states is determined solely by the magnetic field. While it seems that for $\theta > \pi/2$, the energy gap between $m_s=+1, -1$ changes sign, this is just a consequence of choice of the z direction. Denoting $\hat{b}$ as the magnetic field direction, and defining $z'=\text{sign}(\hat{b}\cdot\hat{z})z$, we get that the in this new orientation $\Delta E_{+1,-1}=2|\gamma_E B \cos\theta|>0$.

We now focus on the $\{m_s=0,+1\}$ subspace, and apply as usual a microwave field perpendicular to the magnetic field $\sqrt{2}\Omega \cos(\omega t)$, one gets in the interaction picture (with the RWA approximation)

$$H'=(D+|\gamma_e B \cos(\theta)|-\omega)\sigma_z+\Omega \cos(\theta')\sigma_x.$$

Unfortunately, different crystal orientations with the same value of $\theta$ will have different values of $\theta'$ (the angle from the microwave field).

Thus, NV orientations with the same value of $\theta$, when choosing $\omega=D+|\gamma_e B \cos(\theta)|$ will have different Rabi frequencies, depending on their angle from the MW field orientation.

This challenge can be solved by aligning the microwave field along the magnetic field axis. In this case, the Hamiltonian in the interaction picture becomes $$H'=(D+|\gamma_e B \cos(\theta)|-\omega)\sigma_z+\Omega \sin(\theta')\sigma_x.$$

Now, all NV orientations with the angle $\theta$ from the magnetic field will also have the same Rabi frequency $\Omega \sin(\theta)$. The frequency sweep in this regime needs to be combined with a corresponding change in the microwave amplitude, as $\Omega \sin(\theta)$ should be kept at a relatively constant value. The frequency sweep can now be performed in any range $\theta \in [\theta_{min}, \theta_{max}]$. It is usually preferable for $\theta_{min}$ to start at a value where $\sin\theta_{min}$ is not too small, which would require the microwave driving amplitude to be quite large. $\theta_{min} > 10°$ is usually enough.

The integrated solid effect is a modification to the solid effect scheme by combining it with a microwave sweep. It is usually used for instances where the electron spin resonance (ESR) line is broad compared to the nuclear Larmor frequency, and thus cannot be captured with a single resonant frequency. A rigorous theoretical treatment is given in Henstra, A, and W Th Wenckebach. "Dynamic nuclear polarisation via the integrated solid effect I: theory." Molecular Physics 112.13 (2014): 1761-1772. The relevant portions of the publication are incorporated into the present disclosure by way of reference.

At the first stage the laser polarises the NV centre by optical pumping, as described above. Next, the microwave frequency is swept across the NV centre spin resonance point. In the tilted rotating frame of the nanodiamond relative to the external magnetic field, the Hamiltonian of the system is $$H_{trans} = 2\omega_{eff}\tilde{\sigma}_z + \gamma_n B I_{z'} + \frac{a_{x'}\sin\varphi}{2}(\tilde{\sigma}_+ I'_- + h.c.).$$

With $2\omega_{eff}$ denoting the NV centre effective Rabi frequency, $\gamma_N B$ denoting the nuclear Larmor frequency, $\alpha_{x'}$ the dipolar hyperfine interaction, and $\sin\varphi$ the angle of the tilting. At the beginning of the sweep, $2\omega_{eff}$ is negative, and an adiabatic frequency sweep across the Hartmann Hahn condition $2\omega_{eff}=-\gamma_N B$ polarizes the nuclear spins in a given direction. Then, an adiabatic crossing of $2\omega_{eff}=0$ flips the NV centre electron spin. Thus, when later crossing the $2\omega_{eff}=\gamma_N B$ H.H. condition, the polarization is again performed in the same direction. It is important to note that if the NV centre is not optically repolarized between the two H.H. conditions, the sweep frequency needs to maximize the probability of only one adiabatic (Landau-Zener) transition being performed in the two H.H. conditions. This is due to the fact that the second Lanau-Zener transition in the same sweep will cancel the polarization transfer effect of the first Landau-Zener transition. Thus, also a very slow sweep will not achieve efficient polarization.

Figure 11:
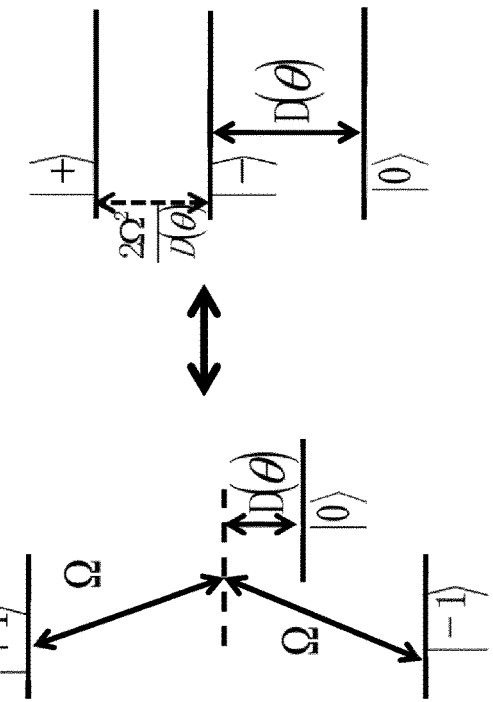
FIG. 11 illustrates the main concepts of overcoming random orientation of colour centres—the solid angle in which the colour centres transfer polarization, the integrated solid effect and the detuned driving schemes.
Figure 11:
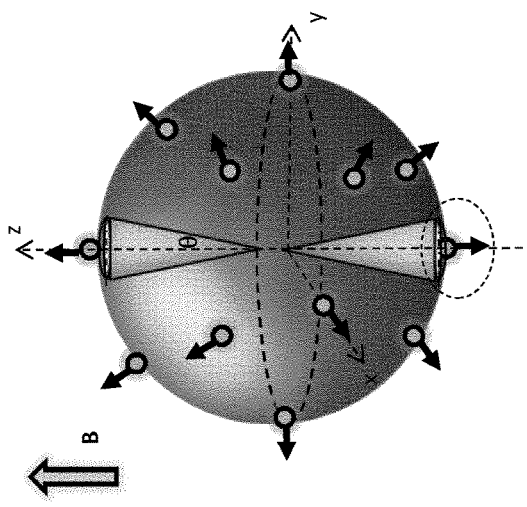
Figure 11:
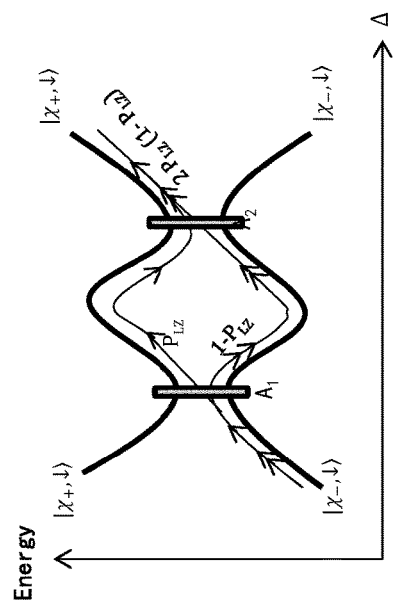

FIG. 11(b) depicts the polarization transfer method with the ISE technique. The resonance occurs twice during the ISE sweep, at the points A1 and A2, where Landau-Zener transitions are possible. Polarisation is achieved when one, and only one, of the Landau-Zener transitions is crossed. An efficient polarization then requires a sweep velocity in an intermediate range.

Larmor frequencies of $^{13}C$ nuclear spins were approximately 5 MHz for magnetic fields used in our experiments, though stronger magnetic fields can be used for larger Larmor frequencies. For an expected average total coupling between the NV centre and external nuclear spins in particles of $\alpha_x \in [0.01 \text{ MHz}, 0.1 \text{ MHz}]$, the frequency sweep velocity should be between 0.1-10 MHz/μs.

Figure 12:
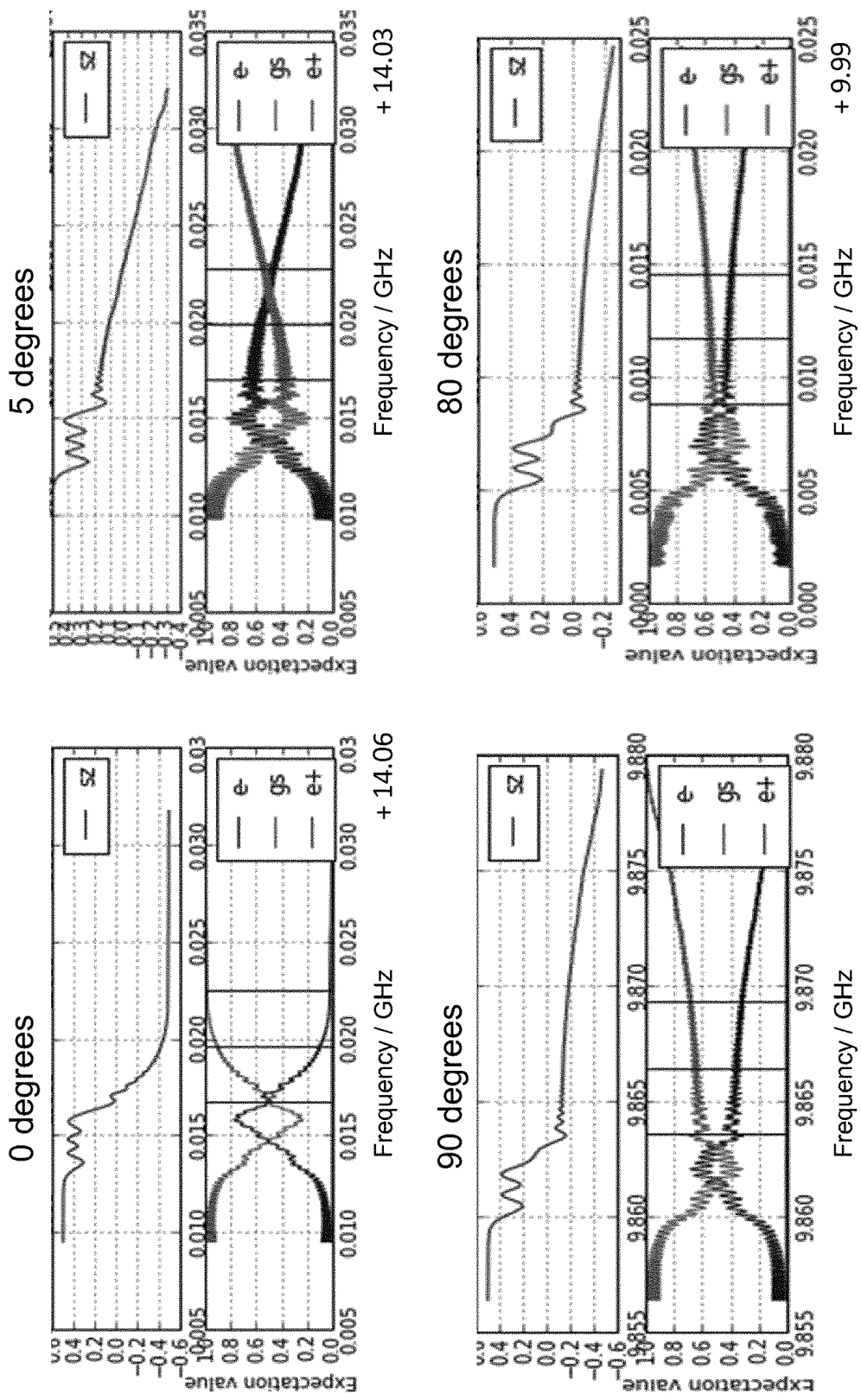
FIG. 12 demonstration of polarisation transfer for different orientations in nanodiamonds.

After a single polarization sweep, the NV centres will be repolarized by optical pumping. Polarisation transfer is then enabled by continuous laser 4 optical pumping combined by microwave frequency sweeps. FIG. 12 demonstrates the efficient polarization transfer between an NV centre and a nuclear spin for various angles in these two ranges using the integrated solid effect. Thus, for a 10 degree deviation, the polarization step can be performed in 130 microseconds. The solid angle given by the 10 degree deviation for $\theta=0$ is shown on FIG. 11(a).

Figure 13:
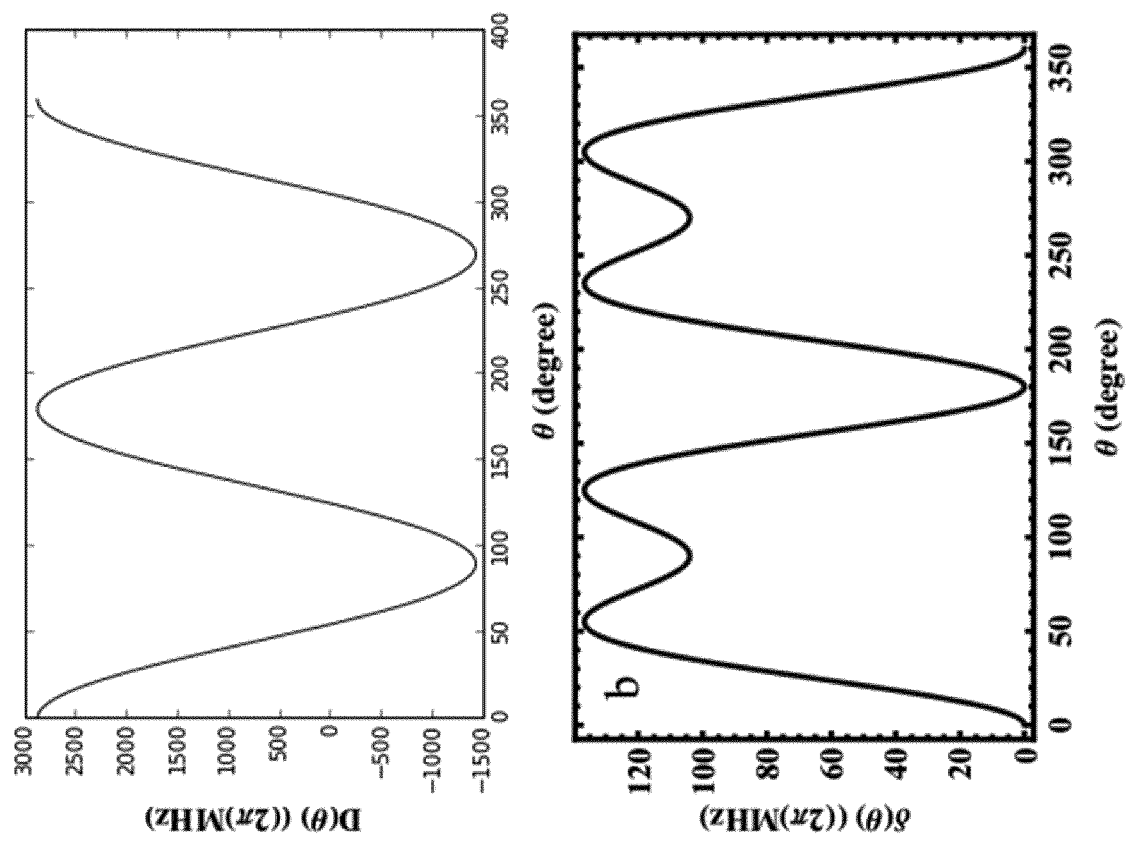
FIG. 13 depicts the dependence on the angle to the external magnetic field in the high magnetic field regime of the zero field splitting and second order corrections to the energy levels.

The polarization transfer can be further greatly improved by using a detuned driving scheme. The polarization transfer from a NV centre to coupled nuclear spins, aided by a detuned driving scheme has been theoretically analysed in Chen Q et al, "Optical hyperpolarization of $^{13}C$ nuclear spins in nanodiamond ensembles", E-print arxiv 1504.02368 (2015); the relevant portions of the publication are incorporated into the present disclosure by way of reference. As noted before, the random orientation of NV center spins in relations to the magnetic field induces a significant variance of the energy levels, as the direction of the natural quantization axis associated with the crystal-field energy splitting is not controllable. Especially, the random orientations cause a large range of the zero-field splitting $$D(\theta) \in [-(2\pi)1.43 \text{ GHz}, (2\pi)2.87 \text{ GHz}],$$

which makes it difficult for polarization transfer. Applying a circularly polarized microwave field, assuming a point-dipole interaction, and neglecting the contact term we obtain $$H_e \simeq \Omega_M(S_x\cos\omega_M t + S_y\sin\omega_M t) + (\gamma_e B + \delta(\theta))S_z +$$
$$D(\theta)S_z^2 + \gamma_n B I_z - gS_z[3e_r^z(e_r^x I_x + e_r^y I_y) + (3(e_r^z)^2 - 1)I_z].$$

Where $\Omega_M=\sqrt{2}\Omega$ is the Rabi frequency of the driving field and $\omega_M$ is its frequency, $\gamma_e B$ ($\gamma_n B$) is the NV centre (nuclear) spin coupling to the external magnetic field, and $\delta(\theta)$ is a correction to the energy levels due to second-order corrections of the misaligned zero field splitting. Consider the off resonant case, $\omega_M=\gamma_e B+\delta(\theta_M)$, with $\delta(\theta)$ shown in FIG. 13b, where $\theta_M$ is the specific chosen angle, the driving is detuned from the $|m_s=-1\rangle \leftrightarrow |m_s=0\rangle$ and $|m_s=0\rangle \leftrightarrow |m_s=+1\rangle$ by the misaligned zero-field splitting $D(\theta)$. In the interaction picture, we get $$H'' = \Omega(|-1\rangle\langle 0| + |0\rangle\langle +1| + h.c.) + D(\theta)S_z^2 + \gamma_n B I_{z'} + S_z \cdot (a_{x'} I_{x'} + a_{z'} I_{z'}).$$

Here $a_{z'}$ and $a_{x'}$ are the elements of the secular and pseudosecular hyperfine interactions, respectively. We proceed with diagonalizing the NV spin Hamiltonian. In the basis $\{|+1\rangle, |0\rangle, |-1\rangle\}$ for the electron spin, the Hamiltonian is $$H_{NV} = \begin{pmatrix} D(\theta) & \Omega & 0 \\ \Omega & 0 & \Omega \\ 0 & \Omega & D(\theta) \end{pmatrix},$$

While the eigenvalues and eigenstates of the Hamiltonian can be solved exactly, we will provide here an approximate answer which provides more insight on the detuned driving concept. As $D(\theta) \gg \Omega$, the eigenstates of this Hamiltonian are approximately $$|\pm\rangle = \frac{1}{\sqrt{2}}(|-1\rangle \pm |+1\rangle),$$

and $|0\rangle$. The $|+\rangle$, $|-\rangle$ states have very similar energies, with an energy gap of $$2\omega_{\textit{eff}} = \frac{\Omega^2}{D(\theta)} \ll D(\theta), \Omega.$$

The $|0\rangle$ state is far detuned with an energy gap of roughly $D(\theta)$ from the $\{|+\rangle, |-\rangle\}$ states. Let's examine the dependence of $2\omega_{\textit{eff}}$ on $\theta$.

$$\frac{\partial(2\omega_{\textit{eff}})}{\partial \theta} = \frac{2\omega_{\textit{eff}}}{D(\theta)} \frac{\partial D(\theta)}{\partial \theta}$$

As $D(\theta) \gg 2\omega_{\textit{eff}}$, this is a radical decrease in the dependence of the energy gap on the angle from the magnetic field. Thus, when tuning the driving microwave amplitude so that $2\omega_{\textit{eff}} = \gamma_n B$, almost all the angle dependence is due to $\delta(\theta)$ (second order corrections to the energy levels), which adds an $S_z$ detuning term to the Hamiltonian. As seen on FIG. 13, $\delta(\theta)$ changes on the order of tens of MHz when varying the magnetic field, compared with several GHz for $D(\theta)$. FIG. 11(c) illustrates the concept of the detuned driving.

A potential polarization scheme can combine the detuned driving, optimal frequency sweep and the integrated solid effect. Focusing on 10 degrees deviation from the perpendicular crystal axis (90 degree deviation from magnetic field orientation):
1. Optically polarize the NV centres to the $\{|+\rangle, |-\rangle\}$ subspace
2. Apply a very fast frequency sweep of the $|0\rangle \leftrightarrow |-\rangle$ transition (can be applied with strong driving amplitude. Sweep duration can be under 1 µs for $\Omega > 10$ MHz). Thus, in the $\{|+\rangle, |-\rangle\}$ subspace, the NV centres are polarized to the $|-\rangle$ state
3. Apply the integrated solid effect protocol with detuned driving for achieving polarization transfer. The sweep should be performed from $\gamma_e B + 91$ MHz to $\gamma_e B + 97$ MHz
4. Repeat steps 1-3

Figure 14:
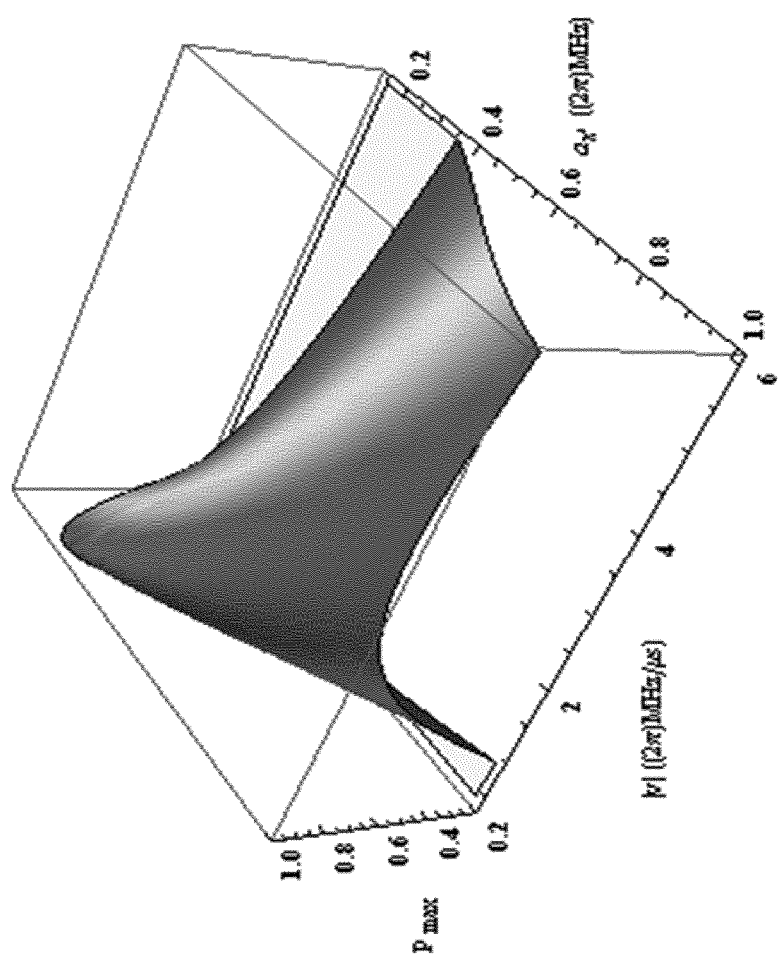
FIG. 14 shows the efficiency of the polarisation transfer with a detuned driving and the integrated solid effects, with dependence on the total coupling strength and the frequency sweep velocity.

FIG. 14 shows the dependence of the polarisation transfer based on the sweep velocity and total coupling to the NV centre spin.

The effect of molecular motion on a detuned driving scheme for achieving the Hartmann-Hahn resonance would be nearly identical to that seen for the NOVEL sequence above.

The invention claimed is:
1. A method of hyperpolarization of nuclear spins in one or more particle(s) moving relatively to a polarisation structure, wherein a polarisation of electron spins in the polarisation structure is transferred to the nuclear spins in the particle(s), wherein
   a. for one or more of the moving particle(s) within 20 nm from a surface of the polarisation structure, the correlation time of the interaction with a nearest polarisation structure electron spin due to the molecular motion is larger than the inverse of the nuclear Larmor frequency;
   b. the electron spins in the polarisation structure are polarised above thermal equilibrium; and
   c. the polarisation transfer is performed resonantly.
2. The method according to claim 1, wherein a diffusion coefficient D of the moving particle(s) which are not at a distance shorter than 100 nm from a surface of the polarisation structure is greater than $10^{-12}$ m$^2$/s.
3. The method according to claim 1, wherein the particles are part of a liquid, and wherein the particles are dissolved in a solvent or suspended in a suspension agent.
4. The method according to claim 1, wherein the polarisation structure comprises a diamond, and wherein the electron spins to be polarised are those of colour centres.
5. The method according to claim 1, wherein the electron spins of the polarisation structure, the polarisation of which is to be transferred to the nuclear spins of the particle(s), are located within less than 1 µm of at least one surface of the polarisation structure.
6. The method according to claim 1, wherein the electron spins in the polarisation structure are polarised by means of optical pumping.
7. The method according to claim 1, wherein the transfer step involves an application of a microwave field or a radio frequency (RF) field.
8. The method according to claim 7, wherein a magnetic flux density of an external magnetic field is smaller than 3 T.
9. The method according to claim 1, wherein the transfer step is performed by an interaction involving at least two electron spins of the polarisation structure and one nuclear spin of a particle.
10. The method according to claim 1, wherein the transfer of polarisation is aided by spins of mediator electrons and, wherein the polarisation transfer from the electron spins of the polarisation structure to the nuclear spins of the particle(s) occurs in two steps such that first the mediator electron spin is polarised by the electron spins of the polarisation structure and then the nuclear spins are polarised by the mediator electron spin.
11. The method according to claim 1, wherein the optical pumping step and the transfer step are repeated cyclically.
12. The method according to claim 10, wherein after each cycle of the polarisation transfer, a pause allows for the nuclear spin polarisations to spread throughout the polarisation structure.
13. The method according to claim 1, wherein at the polarisation transfer the polarisation structure has a temperature of above 70 K.
14. The method according to claim 1, wherein the one or more particle(s) are used in a nuclear magnetic resonance (NMR) imaging application.

15. The method according to claim 1, wherein the polarisation structure is composed of nanoparticles in a packed-bed-type configuration or in a suspension.

16. The method according to claim 1, wherein the polarisation structure is composed of a microfluidic structure, with colour centres in at least one of the channel walls.

17. The method according to claim 2, wherein the transfer of polarisation is aided by spins of mediator electrons and, wherein the polarisation transfer from the electron spins of the polarisation structure to the nuclear spins of the particle(s) occurs in two steps such that first the mediator electron spin is polarised by the electron spins of the polarisation structure and then the nuclear spins are polarised by the mediator electron spin.

\* \* \* \* \*